US012052855B2

(12) United States Patent
Kim et al.

(10) Patent No.: US 12,052,855 B2
(45) Date of Patent: Jul. 30, 2024

(54) SEMICONDUCTOR MEMORY DEVICE

(71) Applicant: Samsung Electronics Co., Ltd., Suwon-si (KR)

(72) Inventors: Hui-Jung Kim, Seongnam-si (KR); Taehyun An, Seoul (KR); Kiseok Lee, Hwaseong-si (KR); Keunnam Kim, Yongin-si (KR); Yoosang Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/165,692

(22) Filed: Feb. 7, 2023

(65) Prior Publication Data

US 2023/0189501 A1   Jun. 15, 2023

Related U.S. Application Data

(63) Continuation of application No. 16/880,230, filed on May 21, 2020, now Pat. No. 11,587,929.

(30) Foreign Application Priority Data

Aug. 5, 2019  (KR) .................. 10-2019-0095029

(51) Int. Cl.
*H10B 12/00* (2023.01)
*G11C 5/06* (2006.01)

(52) U.S. Cl.
CPC .............. *H10B 12/30* (2023.02); *G11C 5/063* (2013.01)

(58) Field of Classification Search
USPC ...................................................... 257/296
(Continued)

(56) References Cited

U.S. PATENT DOCUMENTS 8,324,682 B2   12/2012   Chen et al.
8,357,964 B1   1/2013    Chen et al.
(Continued)

FOREIGN PATENT DOCUMENTS

| KR | 10-2019-0038223 A | 4/2019 |
| KR | 10-2019-0060251 A | 6/2019 |
| KR | 10-2019-0080688 A | 7/2019 |

OTHER PUBLICATIONS

Notice of Allowance dated Oct. 19, 2022 for corresponding U.S. Appl. No. 16/880,230.
(Continued)

*Primary Examiner* — Hrayr A Sayadian
(74) *Attorney, Agent, or Firm* — Harness, Dickey & Pierce, P.L.C.

(57) ABSTRACT

A semiconductor memory device includes a stack including a plurality of layers vertically stacked on a substrate, each of the layers including a bit line extending in a first direction and a semiconductor pattern extending from the bit line in a second direction crossing the first direction, a gate electrode along each of the semiconductor patterns stacked, a vertical insulating layer on the gate electrode, a stopper layer, and a data storing element electrically connected to each of the semiconductor patterns. The data storing element includes a first electrode electrically connected to each of the semiconductor patterns, a second electrode on the first electrode, and a dielectric layer between the first and second electrodes. The stopper layer is between the vertical insulating layer and the second electrode.

20 Claims, 52 Drawing Sheets

(58) Field of Classification Search
IPC ........... H10B 63/30,12/30, 63/84, 12/03; H01L 28/86, 27/10805, 27/2436, 27/1085, 27/2481; G11C 5/063
See application file for complete search history.

(56) References Cited

U.S. PATENT DOCUMENTS

| | | | |
|---|---|---|---|
| 8,441,053 B2 * | 5/2013 | Chen | ...................... H10B 12/20 |
| | | | 365/182 |
| 8,530,312 B2 | 9/2013 | Filippini et al. | |
| 9,023,723 B2 * | 5/2015 | Chang | .................. H10B 12/488 |
| | | | 257/E21.659 |
| 10,134,742 B2 | 11/2018 | Kishida | |
| 10,784,272 B2 | 9/2020 | Lee et al. | |
| 2005/0184327 A1 | 8/2005 | Ozawa | |
| 2009/0261408 A1 | 10/2009 | Fujimoto | |
| 2012/0037970 A1 | 2/2012 | Park et al. | |
| 2019/0067375 A1 * | 2/2019 | Karda | ............... H01L 29/78642 |

OTHER PUBLICATIONS

Office Action dated Jul. 20, 2022 for corresponding U.S. Appl. No. 16/880,230.

* cited by examiner

SEMICONDUCTOR MEMORY DEVICE

CROSS-REFERENCE TO RELATED APPLICATIONS

This application is a continuation of U.S. Application Ser. No. 16/880,230, filed on May 21, 2020, which claims priority to 35 U.S.C. § 119 to Korean Patent Application No. 10-2019-0095029, filed on Aug. 5, 2019, in the Korean Intellectual Property Office, the entire contents of which are hereby incorporated by reference.

BACKGROUND OF THE INVENTION

The present disclosure relates to semiconductor devices, and in particular, to highly-integrated three-dimensional semiconductor memory devices.

Higher integration of semiconductor devices is required to satisfy consumer demands for superior performance and inexpensive prices. In the case of semiconductor devices, as integration is an important factor in determining product prices, increased integration is especially desired. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. To overcome such a limitation, three-dimensional semiconductor memory devices including three-dimensionally arranged memory cells have recently been proposed.

SUMMARY

Some example embodiments of the inventive concepts provides a three-dimensional semiconductor memory device with improved electrical and reliability characteristics.

According to some example embodiments of the inventive concepts, a semiconductor memory device may include a stack including a plurality of layers vertically stacked on a substrate, each of the plurality of layers including a bit line extending in a first direction and a semiconductor pattern extending from the bit line in a second direction crossing the first direction, a gate electrode along each of the semiconductor patterns, a vertical insulating layer on the gate electrode, a stopper layer, and a data storing element electrically connected to each of the semiconductor patterns. The data storing element may include a first electrode electrically connected to each of the semiconductor patterns, a second electrode on the first electrode, and a dielectric layer between the first electrode and the second electrode. The stopper layer may be between the vertical insulating layer and the second electrode.

According to some example embodiments of the inventive concepts, a semiconductor memory device may include a stack including a plurality of layers vertically stacked on a substrate, each of the plurality of layers including a bit line extending in a first direction and a semiconductor pattern extending from the bit line in a second direction crossing the first direction, a gate electrode along each of the semiconductor patterns, first electrodes electrically connected to respective ones of the semiconductor patterns, a stopper layer adjacent the first electrodes, and a second electrode spaced apart from the first electrodes with a dielectric layer therebetween. Each of the first electrodes may include a first portion adjacent to the stopper layer and a second portion extended from the first portion in the second direction. A largest width of the first portion in the first direction may be smaller than a largest width of the second portion in the first direction.

According to some example embodiments of the inventive concepts, a semiconductor memory device may include a stack including a plurality of layers vertically stacked on a substrate, each of the plurality of layers including a bit line extending in a first direction and a semiconductor pattern extending from the bit line in a second direction crossing the first direction, a gate electrode along each of the semiconductor patterns, first electrodes electrically connected to respective ones of the semiconductor patterns, conductive pads between each of the semiconductor patterns and respective ones of the first electrodes, a stopper layer between adjacent ones of the conductive pads, and a second electrode spaced apart from the first electrodes with a dielectric layer therebetween. A largest width of the conductive pad in the first direction may be smaller than a largest width of the first electrode in the first direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
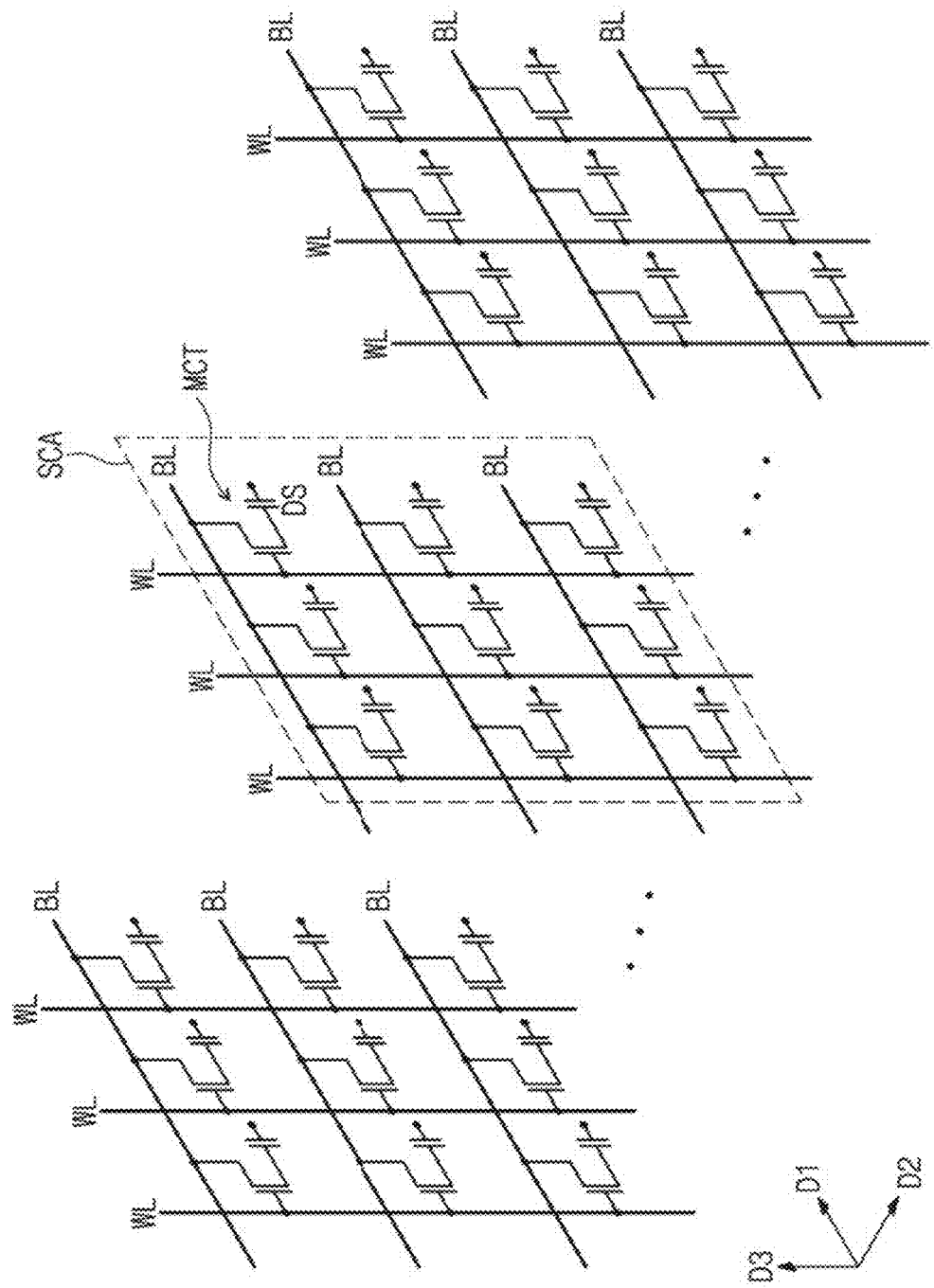
FIG. 1 is a schematic circuit diagram illustrating a cell array of a three-dimensional semiconductor memory device according to some example embodiments of the inventive concepts.

FIG. 1 is a schematic circuit diagram illustrating a cell array of a three-dimensional semiconductor memory device according to some example embodiments of the inventive concepts.

Referring to FIG. 1, a cell array of a three-dimensional semiconductor memory device according to some example embodiments of the inventive concepts may include a plurality of sub-cell arrays SCA. The sub-cell arrays SCA may be arranged in a second direction D2.

Each of the sub-cell arrays SCA may include a plurality of bit lines BL, a plurality of word lines WL, and a plurality of memory cell transistors MCT. Each of the memory cell transistors MCT may be placed between a corresponding one of the word lines WL and a corresponding one of the bit lines BL.

The bit lines BL may be conductive patterns (e.g., metal lines), which are spaced apart from, or stacked on, a substrate. The bit lines BL may be extended in a first direction D1. The bit lines BL in each of the sub-cell arrays SCA may be spaced apart from each other in a vertical direction (e.g., a third direction D3).

The word lines WL may be conductive patterns (e.g., metal line) extending from the substrate in the vertical direction (e.g., in the third direction D3). The word lines WL in each of the sub-cell arrays SCA may be spaced apart from each other in the first direction D1.

A gate electrode of the memory cell transistor MCT may be connected to the word line WL, and a source electrode of the memory cell transistor MCT may be connected to the bit line BL. Each of the memory cell transistors MCT may include a data storing element DS. For example, the data storing element DS may be a capacitor, and a drain electrode of the memory cell transistor MCT may be connected to the capacitor.

Figure 2:
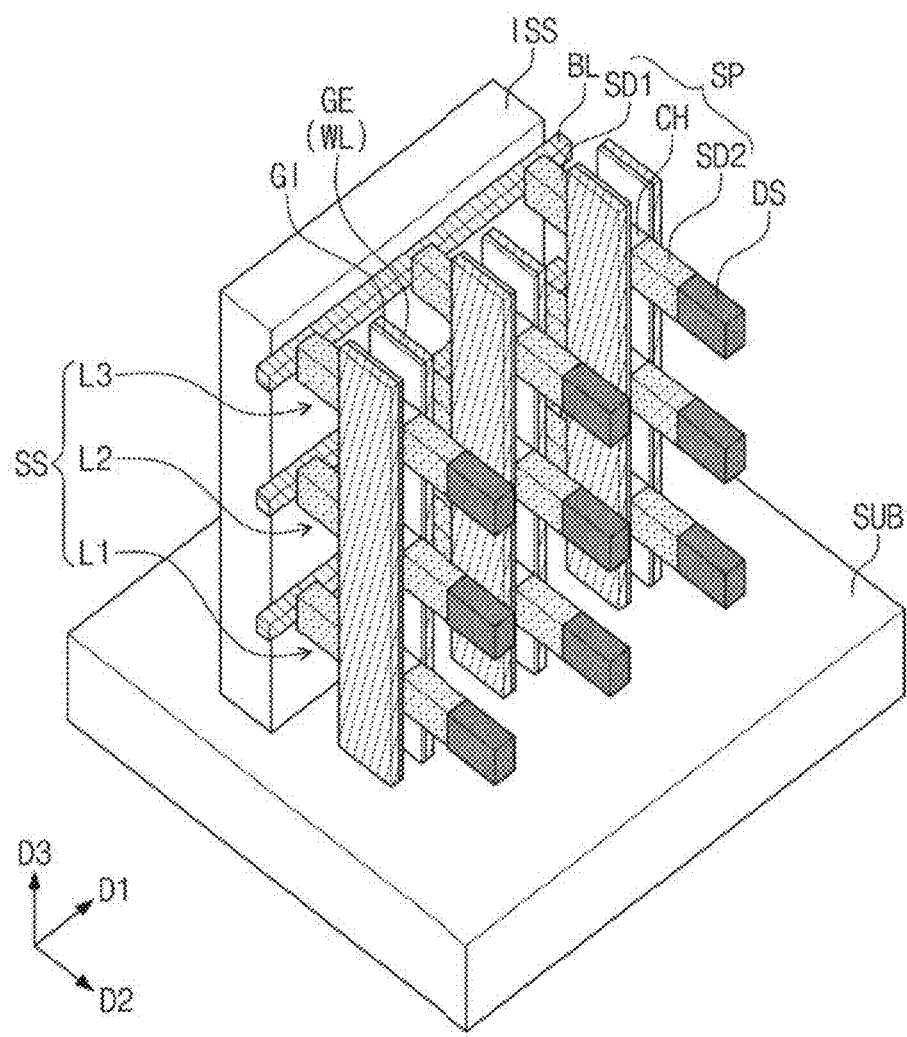
FIG. 2 is a perspective view illustrating a three-dimensional semiconductor memory device according to some example embodiments of the inventive concepts.

FIG. 2 is a perspective view illustrating a three-dimensional semiconductor memory device according to some example embodiments of the inventive concepts.

Referring to FIGS. 1 and 2, one of the sub-cell arrays SCA described with reference to FIG. 1 may be provided on a substrate SUB. The substrate SUB may be a silicon substrate, a germanium substrate, or a silicon-germanium substrate.

In detail, a stack SS including first to third layers L1, L2, and L3 may be provided on the substrate SUB. The first to third layers L1, L2, and L3 of the stack SS may be stacked to be spaced apart from each other in the vertical direction (i.e., in the third direction D3). Each of the first to third layers L1, L2, and L3 may include a plurality of semiconductor patterns SP, a plurality of data storing elements DS, and a bit line BL.

Each of the semiconductor patterns SP may be a line-, bar-, or pillar-shaped pattern extending in the second direction D2. In some example embodiments, the semiconductor patterns SP may be formed of or include silicon, germanium, or silicon-germanium. Each of the semiconductor patterns SP may include a channel region CH, a first impurity region SD1, and a second impurity region SD2. The channel region CH may be interposed between the first and second impurity regions SD1 and SD2. The channel region CH may correspond to a channel region of the memory cell transistor MCT described with reference to FIG. 1. The first and second impurity regions SD1 and SD2 may correspond to the source and drain electrodes of the memory cell transistor MCT described with reference to FIG. 1.

The first and second impurity regions SD1 and SD2 may be regions of the semiconductor pattern SP that are doped with impurities. In some example embodiments, a conductivity type of the first and second impurity regions SD1 and SD2 may be an n-type or p-type.

The data storing elements DS may be connected to end portions of the semiconductor patterns SP, respectively. The data storing elements DS may be connected to the second impurity regions SD2 of the semiconductor patterns SP, respectively. The data storing elements DS may be memory elements configured to store data. Each of the data storing elements DS may be a memory element using a capacitor, a memory element using a magnetic tunnel junction pattern, or a memory element using a variable resistance material (e.g., a phase-change material). In some example embodiments, each of the data storing elements DS may be a capacitor.

Each of the bit lines BL may be a line- or bar-shaped pattern extending in the first direction D1. The bit lines BL may be stacked to be spaced apart from each other in the third direction D3. The bit lines BL may be formed of or include a conductive material. For example, the conductive material may be one of doped semiconductor materials (doped silicon, doped germanium, and/or so forth), conductive metal nitrides (titanium nitride, tantalum nitride, and/or so forth), metallic materials (tungsten, titanium, tantalum, and/or so forth), and/or metal-semiconductor compounds (tungsten silicide, cobalt silicide, titanium silicide, and/or so forth). The bit lines BL may be the bit lines BL described with reference to FIG. 1.

Hereinafter, the first layer L1 will be described in more detail as a typical example of the first to third layers L1, L2, and L3. The semiconductor patterns SP in the first layer L1 may be arranged to be spaced apart from each other in the first direction D1. The semiconductor patterns SP in the first layer L1 may be positioned at the same level (e.g., a first level). The bit line BL in the first layer L1 may be connected to end portions of the semiconductor patterns SP in the first layer L1. In some example embodiments, the bit line BL may be directly connected to the first impurity regions SD1. In certain example embodiments, the bit line BL may be electrically connected to the first impurity region SD1 through metal silicide patterns. The second layer L2 and the third layer L3 may be configured to have substantially the same features as those of the first layer L1 described above.

Gate electrodes GE may be provided on the substrate SUB to penetrate the stack SS. The gate electrodes GE may be line- or pillar-shape patterns extending in the third direction D3. The gate electrodes GE may be arranged in the first direction D1. The semiconductor patterns SP, which are vertically stacked, may be interposed between a pair of the gate electrodes GE, when viewed in a plan view. Each of the gate electrodes GE may be vertically extended to face side surfaces of the semiconductor patterns SP, which are vertically stacked.

In some example embodiments, the first pair of the gate electrodes GE may be adjacent to the first semiconductor pattern of the semiconductor patterns SP in the first layer L1, the first semiconductor pattern of the semiconductor patterns SP in the second layer L2, and the first semiconductor pattern of the semiconductor patterns SP in the third layer L3. The second pair of the gate electrodes GE may be adjacent to the second semiconductor pattern of the semiconductor patterns SP in the first layer L1, the second semiconductor pattern of the semiconductor patterns SP in the second layer L2, and the second semiconductor pattern of the semiconductor patterns SP in the third layer L3.

The gate electrode GE may be disposed adjacent to the channel region CH of the semiconductor pattern SP. The gate electrode GE may be disposed on a side surface of the channel region CH and may be extended in the third direction D3. A gate insulating layer GI may be interposed between the gate electrode GE and the channel region CH. The gate insulating layer GI may be a single- or multi-layered structure that is formed of or include at least one of high-k dielectric materials, silicon oxide, silicon nitride, and/or silicon oxynitride. In some example embodiments, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

The gate electrodes GE may be formed of or include a conductive material, and the conductive material may be one of doped semiconductor materials, conductive metal nitrides, metallic materials, and/or metal-semiconductor compounds. The gate electrodes GE may be the word lines WL described with reference to FIG. 1.

An insulating structure ISS may be provided on the substrate SUB to extend along a side surface of the stack SS and in the first direction D1. Opposite end portions of the semiconductor patterns SP may be in contact with the insulating structure ISS. The insulating structure ISS may be formed of or include at least one of silicon oxide, silicon nitride, and/or silicon oxynitride.

Although not shown, empty spaces of the stack SS may be filled with an insulating material. For example, the insulating material may be formed of or include at least one of silicon oxide, silicon nitride, and/or silicon oxynitride.

Figure 3:
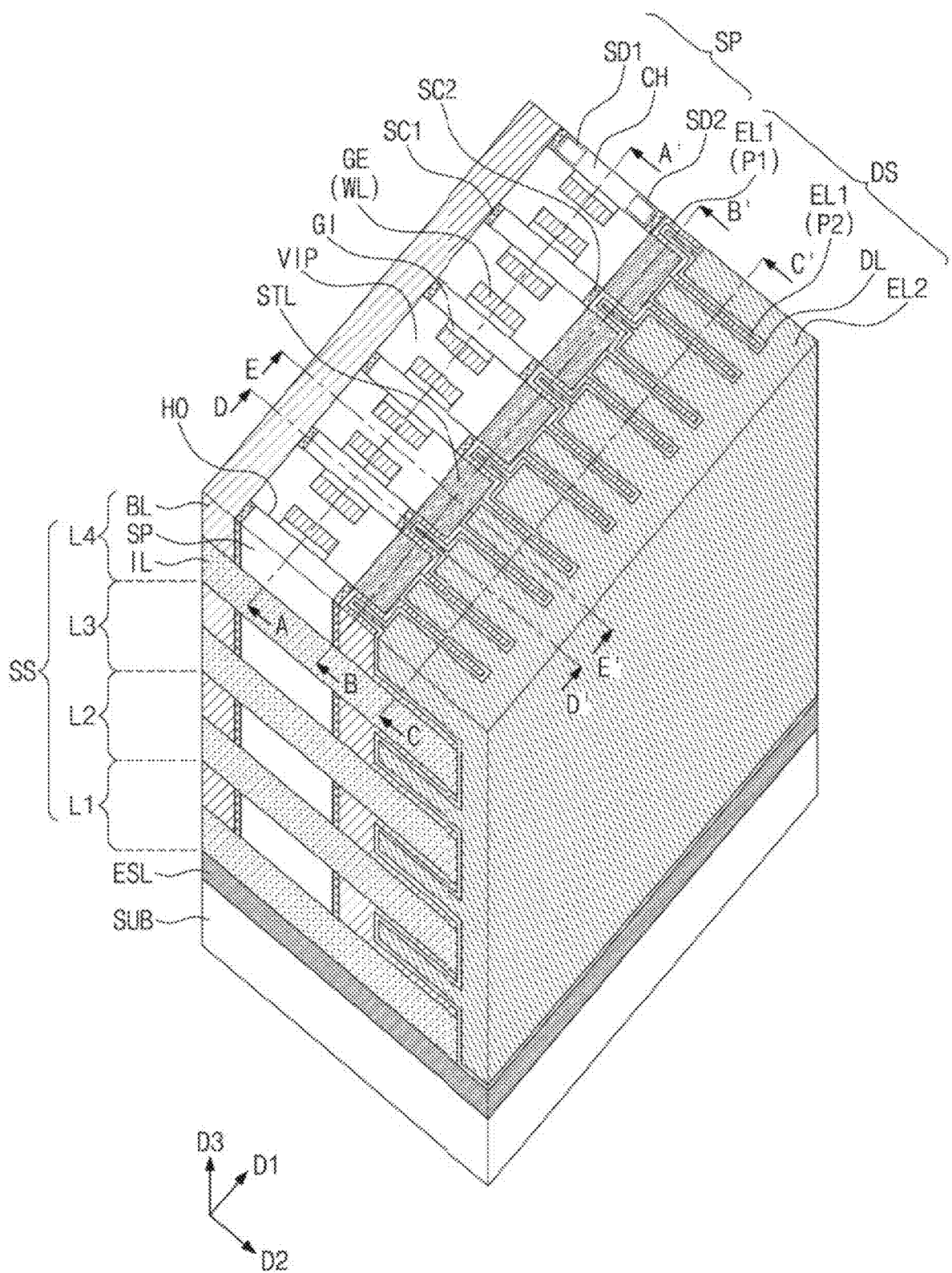
FIG. 3 is a perspective view illustrating a three-dimensional semiconductor memory device according to some example embodiments of the inventive concepts.
Figure 4A:
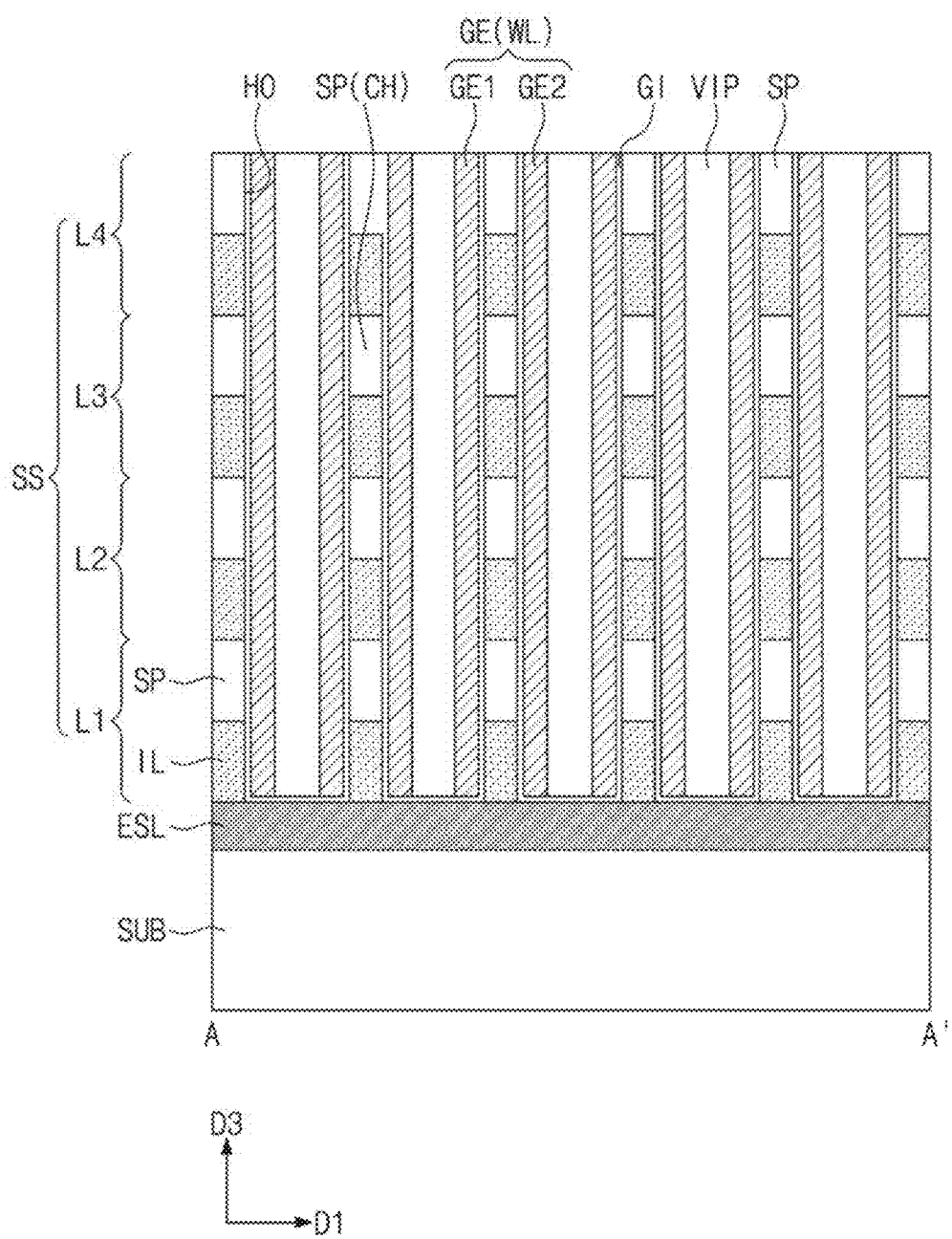
FIGS. 4A to 4E are sectional views taken along lines A-A', B-B', D-D', and E-E', respectively, of FIG. 3.
Figure 4B:
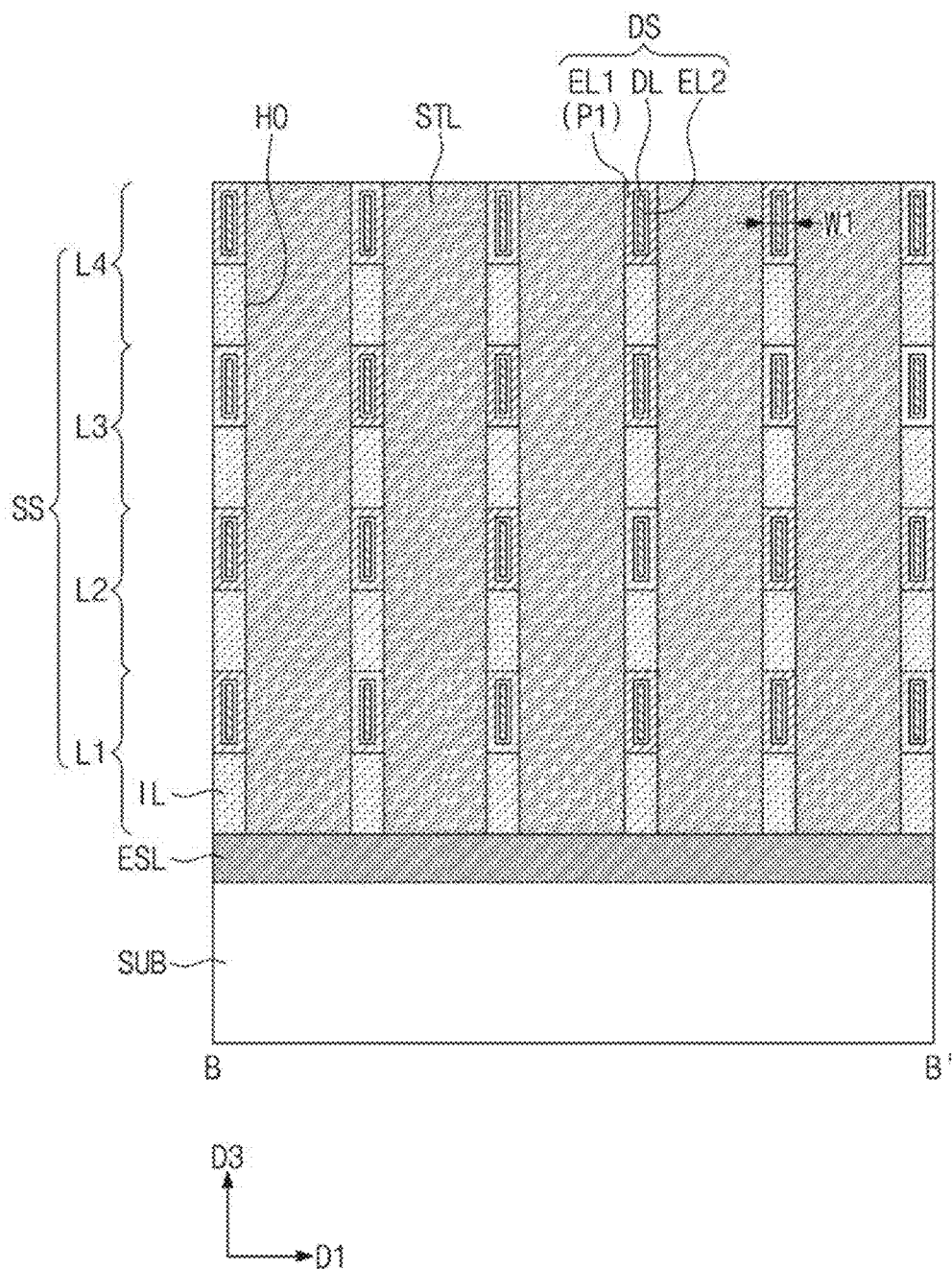
Figure 4C:
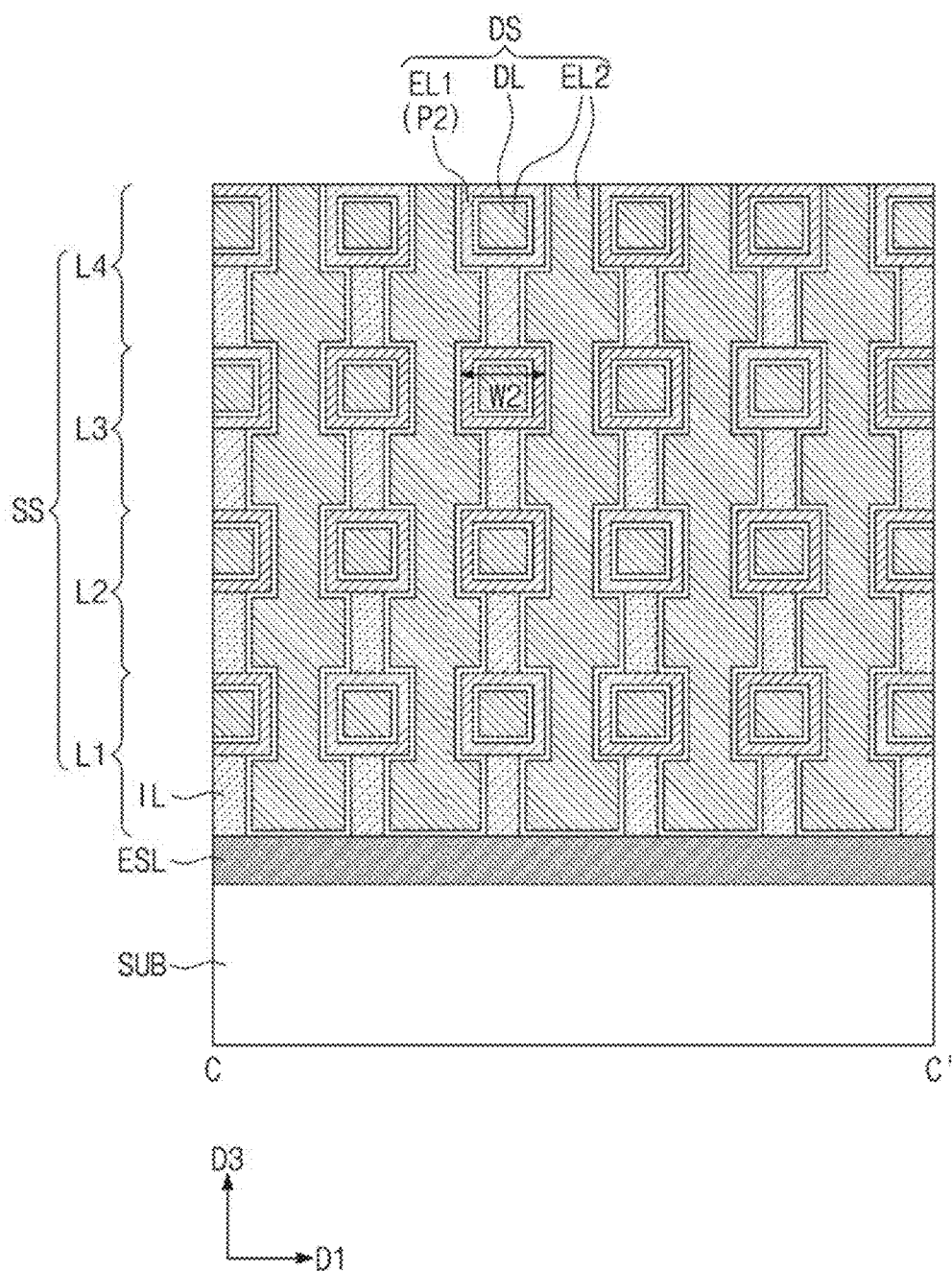
Figure 4D:
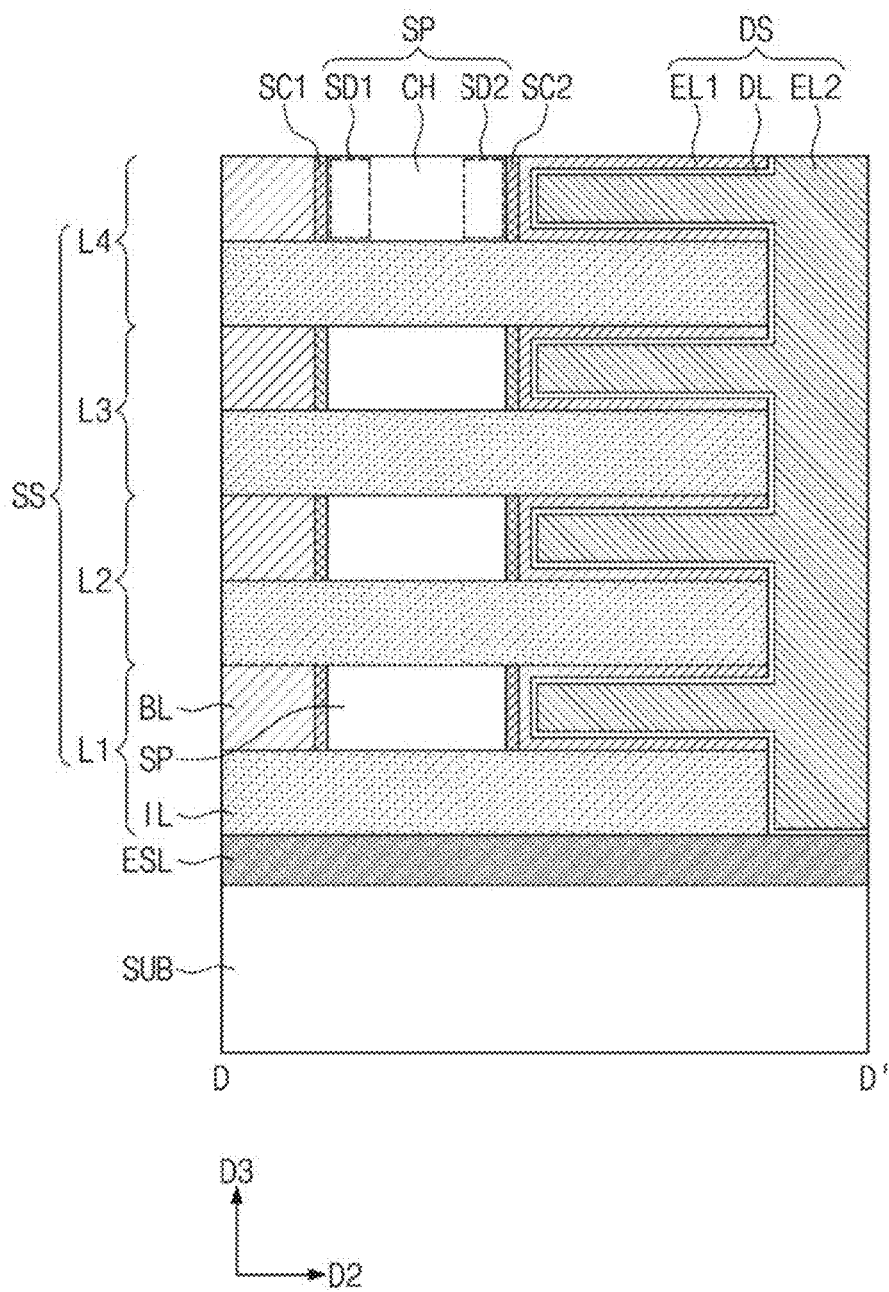
Figure 4E:
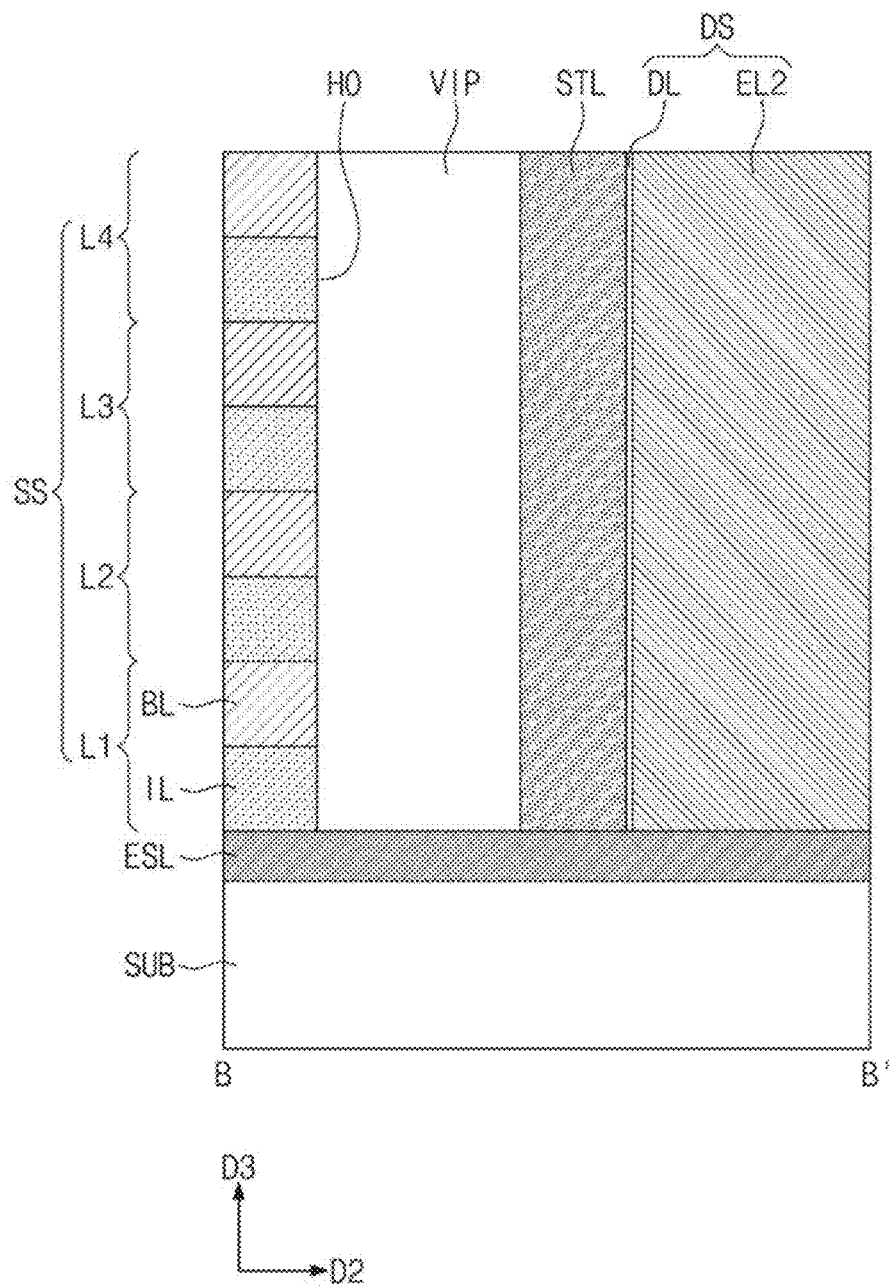

FIG. 3 is a perspective view illustrating a three-dimensional semiconductor memory device according to some example embodiments of the inventive concepts. FIGS. 4A to 4E are sectional views taken along lines A-A', B-B', C-C', D-D', and E-E', respectively, of FIG. 3. For concise description, an element previously described with reference to FIGS. 1 and 2 will be identified by the same reference number without repeating an overlapping description thereof, and features different from that of the previous embodiment will be described in more detail below.

Referring to FIGS. 3 and 4A to 4E, the stack SS may be provided on the substrate SUB. The stack SS may be extended in the first direction D1. Although not shown, a plurality of the stacks SS may be arranged in the second direction D2.

The stack SS may include first to fourth layers L1, L2, L3, and L4, which are sequentially stacked on the substrate SUB. Each of the first to fourth layers L1, L2, L3, and L4 may include an insulating layer IL, the semiconductor pattern SP, and the bit line BL. The stack SS may further include an etch stop layer ESL, which is interposed between the substrate SUB and the first layer L1. Although the first to fourth layers L1, L2, L3, and L4 are exemplarily illustrated in the present embodiments, one or more layers may be further stacked on the fourth layer L4.

The semiconductor pattern SP and the bit line BL may be provided on the insulating layer IL. The semiconductor pattern SP and the bit line BL may be disposed on the insulating layer IL to be parallel to each other. The insulating layer IL may separate the semiconductor pattern SP and the bit line BL in an upper layer from the semiconductor pattern SP and the bit line BL in a lower layer in the vertical direction (i.e., in the third direction D3).

The bit line BL in each of the first to fourth layers L1, L2, L3, and L4 may be extended in the first direction D1. The bit line BL may be positioned at the same level as the semiconductor pattern SP. A side surface of the bit line BL may face a side surface of the semiconductor pattern SP. The side surface of the bit line BL may be in contact with the side surface of the semiconductor pattern SP.

The semiconductor pattern SP may be formed of or include a semiconductor material (e.g., silicon, germanium, or silicon-germanium). The insulating layer IL may be formed of at least one material selected from the group consisting of silicon oxide, silicon nitride, silicon oxynitride, carbon-containing silicon oxide, carbon-containing silicon nitride, and/or carbon-containing silicon oxynitride. For example, the insulating layer IL may be a silicon nitride (SiN) layer.

In some example embodiments, a plurality of the semiconductor patterns SP may be provided in each of the first to fourth layers L1, L2, L3, and L4. The semiconductor patterns SP in each of the first to fourth layers L1, L2, L3, and L4 may be bar-shaped patterns extending from the bit line BL in the second direction D2. Each of the semiconductor patterns SP may include the channel region CH, the first impurity region SD1, and the second impurity region SD2. The channel region CH may be interposed between the first and second impurity regions SD1 and SD2. The bit line BL may be electrically connected to the first impurity region SD1 of the semiconductor pattern SP.

Holes HO may be defined in the stack SS to penetrate the stack SS. The hole HO may be located between the semiconductor patterns SP. The gate electrodes GE may be provided in the hole HO penetrating the stack SS to extend in the vertical direction (i.e., in the third direction D3). In other words, the gate electrodes GE may be provided to penetrate the stack SS.

The gate electrodes GE may include a first gate electrode GE1 and a second gate electrode GE2, which are respectively provided at both sides of the channel region CH of the semiconductor pattern SP. In some example embodiments, the first and second gate electrodes GE1 and GE2 may include a single word line WL. In certain example embodiments, the first gate electrode GE1 may be the word line WL, and the second gate electrode GE2 may be a back gate.

The gate insulating layer GI may be interposed between each of the gate electrodes GE and each of the semiconductor patterns SP. The gate insulating layer GI may be a single- or multi-layered structure that is formed of or include at least one of high-k dielectric materials, silicon oxide, silicon nitride, and/or silicon oxynitride.

A vertical insulating layer VIP may be provided to fill the holes HO. The vertical insulating layer VIP may cover the gate electrodes GE. In some example embodiments, the vertical insulating layer VIP may be interposed between an adjacent pair of the gate electrodes GE, in the hole HO. The vertical insulating layer VIP may be interposed between an adjacent pair of the semiconductor patterns SP. The vertical insulating layer VIP may be formed of or include at least one of silicon oxide, silicon nitride, and/or silicon oxynitride. For example, the vertical insulating layer VIP may include a silicon oxide layer that has an etch selectivity with respect to the insulating layer IL.

The data storing elements DS may be provided to be electrically connected to the semiconductor patterns SP, respectively. Each of the data storing elements DS may include a first electrode EL1, a dielectric layer DL, and a second electrode EL2. The data storing elements DS in the stack SS may share a single dielectric layer DL and a single second electrode EL2. For example, a plurality of the first electrodes EL1 may be provided in the stack SS, and surfaces of the first electrodes EL1 may be covered with the single dielectric layer DL. The single second electrode EL2 may be provided on the single dielectric layer DL.

Each of the first electrode EL1 and the second electrode EL2 may be formed of or include at least one of metallic materials (e.g., titanium, tantalum, tungsten, copper, and/or aluminum), conductive metal nitrides (e.g., titanium nitride and/or tantalum nitride), and/or doped semiconductor materials (e.g., doped silicon and/or doped germanium). The dielectric layer DL may be formed of or include at least one of high-k dielectric materials (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate).

A stopper layer STL may be further provided to fill the holes HO. In other words, each of the holes HO may be filled with the vertical insulating layer VIP and the stopper layer STL. The stopper layer STL may be interposed between the vertical insulating layer VIP and the second electrode EL2. The stopper layer STL may be a pillar-shape pattern, which is provided in the hole HO to penetrate the stack SS. The stopper layer STL may be vertically extended along the vertical insulating layer VIP. The dielectric layer DL may be interposed between the stopper layer STL and the second electrode EL2. The dielectric layer DL may cover a side surface of the stopper layer STL.

The stopper layer STL may be formed of or include a material that is selected from the group consisting of silicon oxide, silicon nitride, silicon oxynitride, carbon-containing silicon oxide, carbon-containing silicon nitride, and/or carbon-containing silicon oxynitride. The stopper layer STL may have an etch selectivity with respect to the vertical insulating layer VIP and the insulating layer IL.

Each of the first electrodes EL1 may be a cylinder-shaped pattern with an opened end portion. The first electrode EL1 may include a first portion P1, which is interposed between adjacent ones of the stopper layers STL, and a second portion P2, which is extended from the first portion P1 in the second direction D2. The first portion P1 may be electrically connected to the second impurity region SD2 of the semiconductor pattern SP. The stopper layer STL may be interposed between adjacent ones of the first portions P1.

The largest width of the first portion P1 in the first direction D1 may be a first width W1. The largest width of the second portion P2 in the first direction D1 may be a second width W2. The second width W2 may be greater than the first width W1. A length of the first portion P1 in the second direction D2 may be substantially equal to a width of the stopper layer STL in the second direction D2.

A first silicide pattern SC1 may be interposed between the bit line BL and the semiconductor pattern SP. A second silicide pattern SC2 may be interposed between the semiconductor pattern SP and the first electrode EL1. The bit line BL may be electrically connected to the first impurity region SD1 through the first silicide pattern SC1. The first electrode EL1 may be electrically connected to the second impurity region SD2 through the second silicide pattern SC2. The first and second silicide patterns SC1 and SC2 may be formed of or include at least one of metal silicides (e.g., cobalt silicide).

According to some example embodiments of the inventive concepts, the end portions of the stacked semiconductor patterns SP may be vertically aligned to each other by the stopper layer STL. In other words, the uniformity in length of the stacked semiconductor patterns SP may be improved due to the stopper layer STL. Due to the stopper layer STL, the first electrodes EL1, which are connected to the semiconductor patterns SP, respectively, may be formed to have the same size and the same shape. As a result, it may be possible to improve electrical and reliability characteristics of three-dimensional semiconductor memory device.

FIGS. 5, 7, 9, 11, 13, 15, 17, 19, and 21 are plan views illustrating a method of fabricating a three-dimensional semiconductor memory device, according to some example embodiments of the inventive concepts. FIGS. 6, 8A, 10A, 12A, 14A, 16A, 18A, 20A, and 22A are sectional views taken along lines A-A' of FIGS. 5, 7, 9, 11, 13, 15, 17, 19, and 21, respectively. FIGS. 8B, 10B, 12B, 14B, 16B, 18B, 20B, and 22B are sectional views taken along lines B-B' of FIGS. 7, 9, 11, 13, 15, 17, 19, and 21, respectively.

Figure 5:
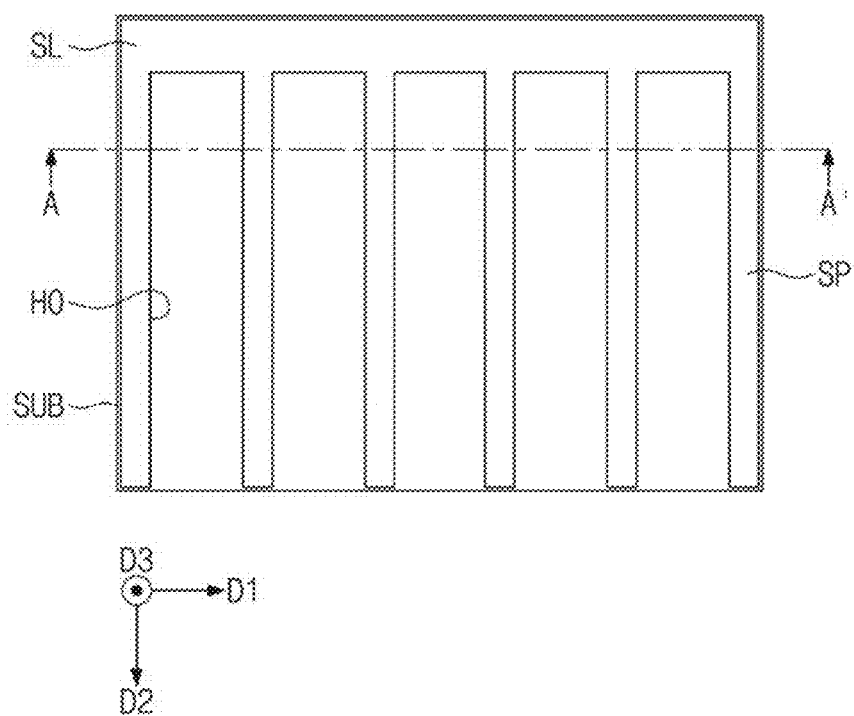
FIGS. 5, 7, 9, 11, 13, 15, 17, 19, and 21 are plan views illustrating a method of fabricating a three-dimensional semiconductor memory device, according to some example embodiments of the inventive concepts.
Figure 6:
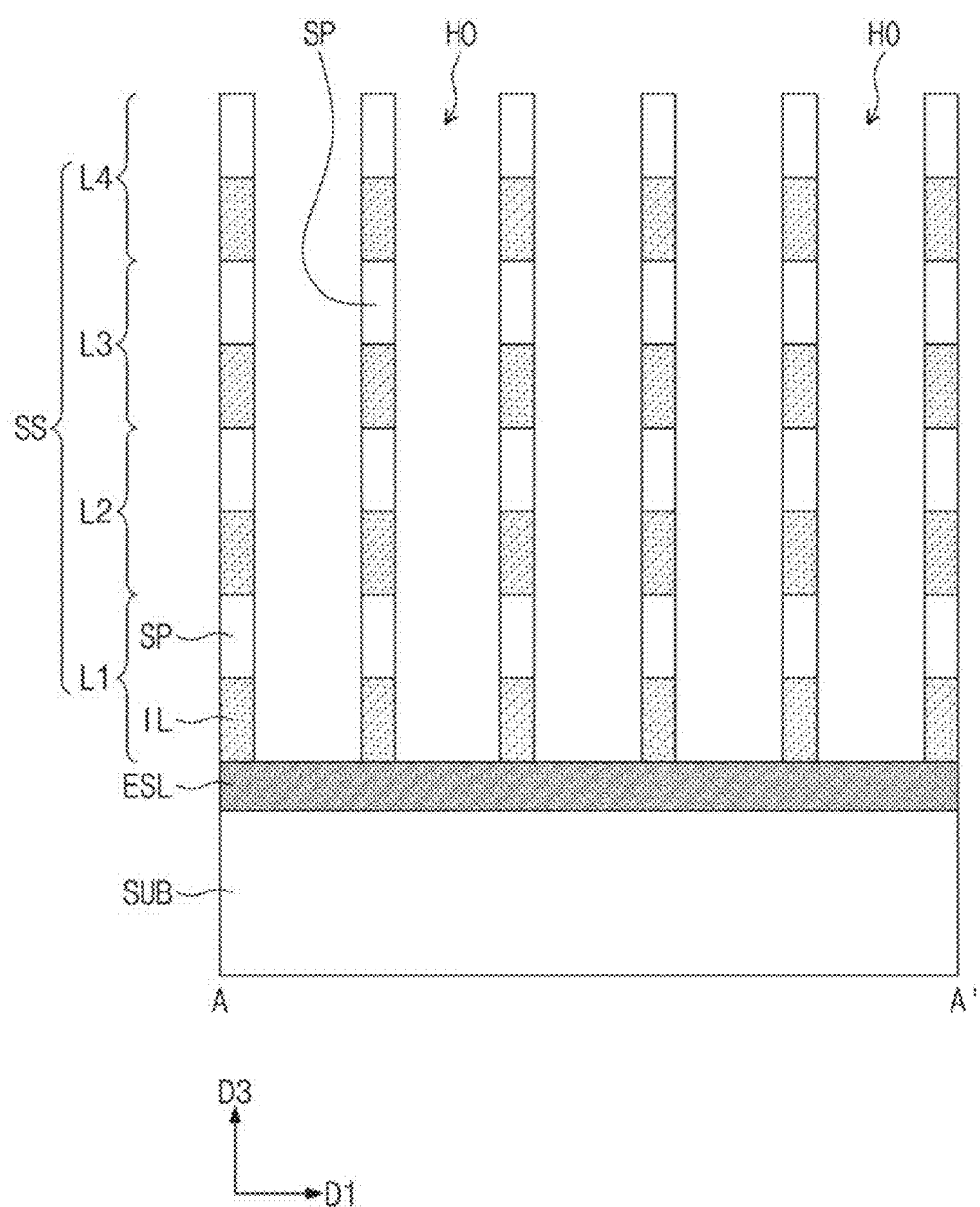
FIGS. 6, 8A, 10A, 12A, 14A, 16A, 18A, 20A, and 22A are sectional views taken along lines A-A' of FIGS. 5, 7, 9, 11, 13, 15, 17, 19, and 21, respectively.

Referring to FIGS. 5 and 6, the etch stop layer ESL may be formed on the substrate SUB. The stack SS may be formed on the etch stop layer ESL. The formation of the stack SS may include forming the first to fourth layers L1, L2, L3, and L4, which are stacked on the etch stop layer ESL.

Each of the first to fourth layers L1, L2, L3, and L4 may include the insulating layer IL and a semiconductor layer SL. The insulating layer IL and the semiconductor layer SL may be sequentially formed. The semiconductor layer SL may be formed of or include a semiconductor material (e.g., silicon, germanium, or silicon-germanium). The insulating layer IL may be formed of at least one material selected from the group consisting of silicon oxide, silicon nitride, silicon oxynitride, carbon-containing silicon oxide, carbon-containing silicon nitride, and/or carbon-containing silicon oxynitride. For example, the insulating layer IL may be formed of a silicon nitride (SiN) layer.

The stack SS may be patterned to form the holes HO penetrating the stack SS. The holes HO may not penetrate the etch stop layer ESL on the substrate SUB. Due to the etch stop layer ESL, a top surface of the substrate SUB may not be exposed through the holes HO.

Each of the holes HO may be a line- or bar-shaped empty region extending in the second direction D2. The holes HO may be formed to be spaced apart from each other in the first direction D1. Due to the holes HO, the semiconductor patterns SP may be defined in each of the semiconductor layers SL. For example, the semiconductor pattern SP may be defined between an adjacent pair of the holes HO. The semiconductor patterns SP may be bar-shaped patterns extending in the second direction D2.

Figure 7:
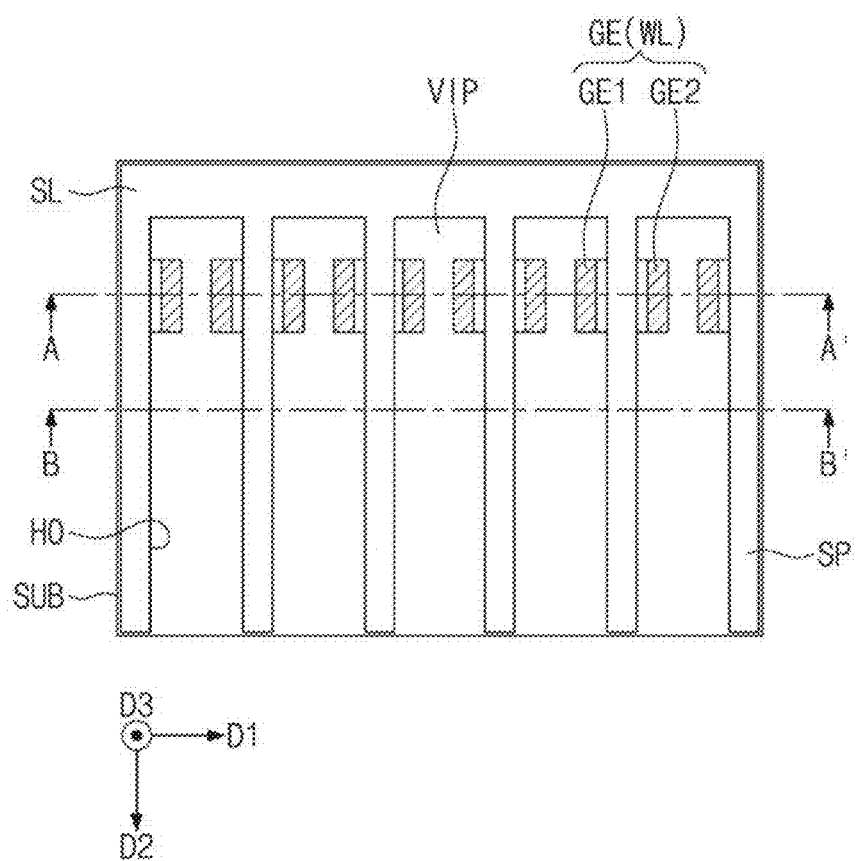
Figure 8A:
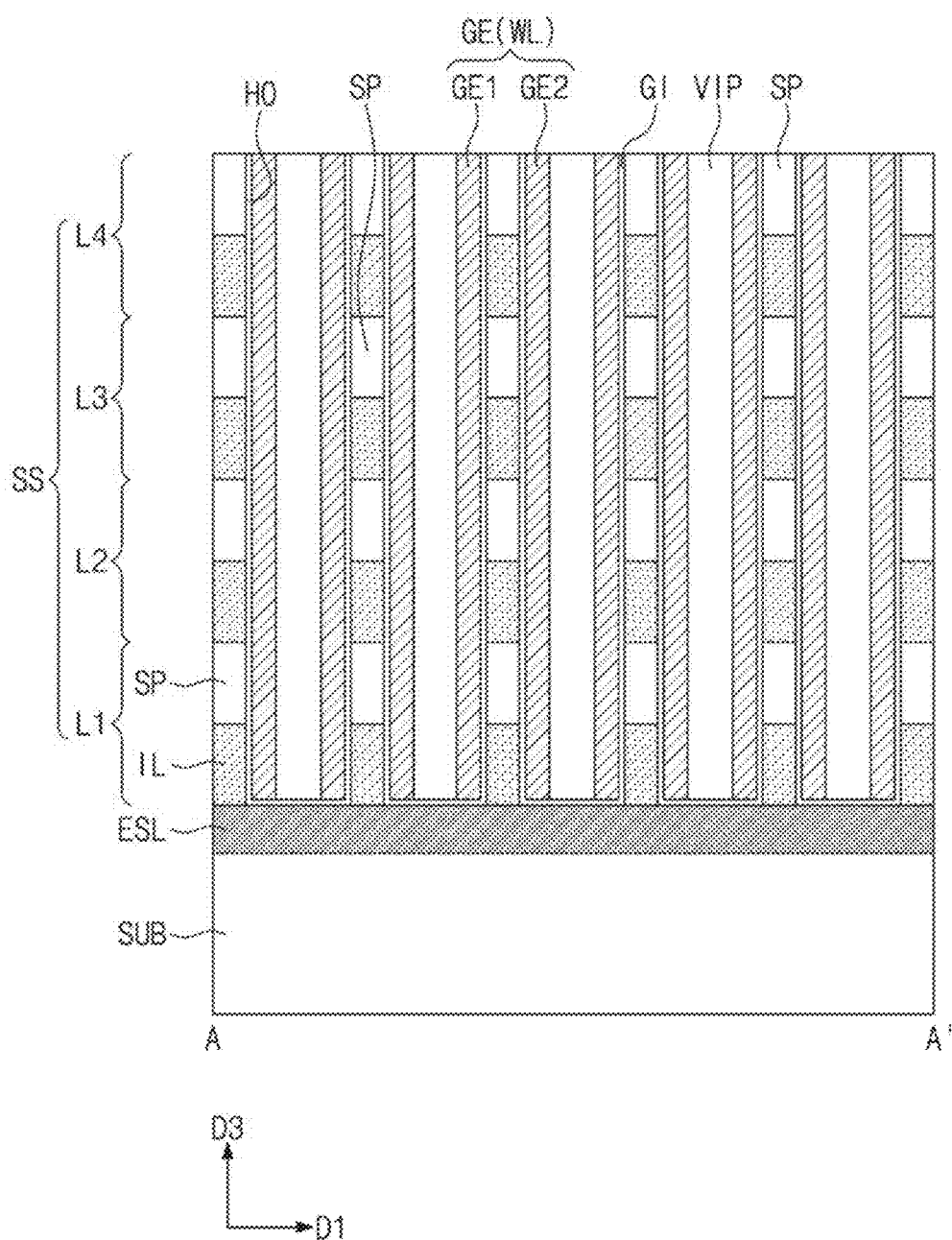
Figure 8B:
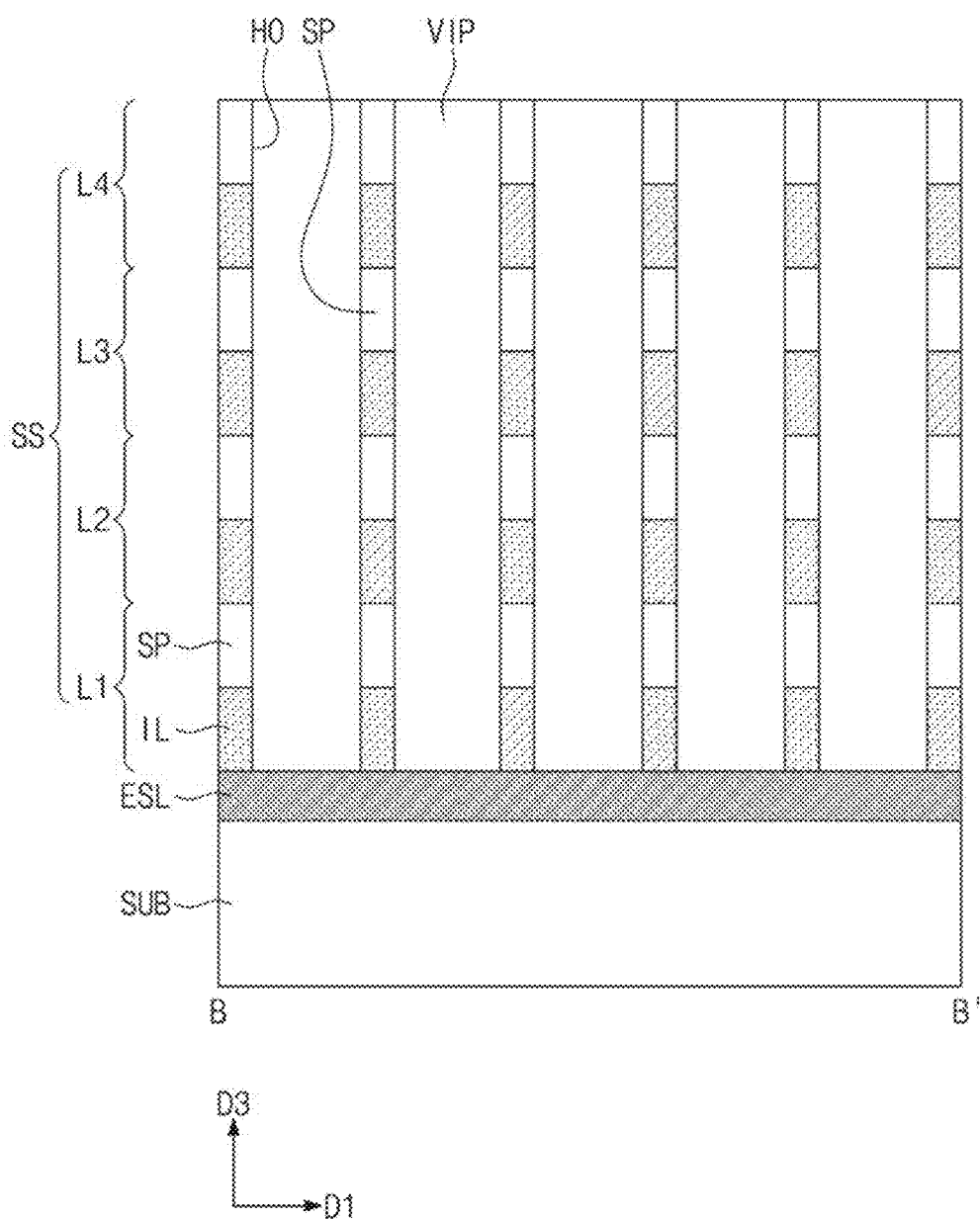
FIGS. 8B, 10B, 12B, 14B, 16B, 18B, 20B, and 22B are sectional views taken along lines B-B' of FIGS. 7, 9, 11, 13, 15, 17, 19, and 21, respectively.

Referring to FIGS. 7 and 8, the gate electrodes GE and the gate insulating layers GI may be formed in each of the holes HO. In detail, a gate insulating layer and a gate electrode layer may be formed in the holes HO and may be patterned to form the gate electrodes GE and the gate insulating layers GI. The gate electrode GE and the gate insulating layer GI may be extended along an inner side surface of the stack SS exposed by the hole HO and in the third direction D3. The gate electrodes GE may include the first gate electrode GE1 and the second gate electrode GE2, which are provided at both sides of the semiconductor pattern SP.

After the formation of the gate electrodes GE, the vertical insulating layer VIP may be formed to fill the holes HO. The vertical insulating layer VIP may be formed of or include at least one of silicon oxide, silicon nitride, and/or silicon oxynitride. For example, the vertical insulating layer VIP may include a silicon oxide layer that has an etch selectivity with respect to the insulating layer IL.

Figure 9:
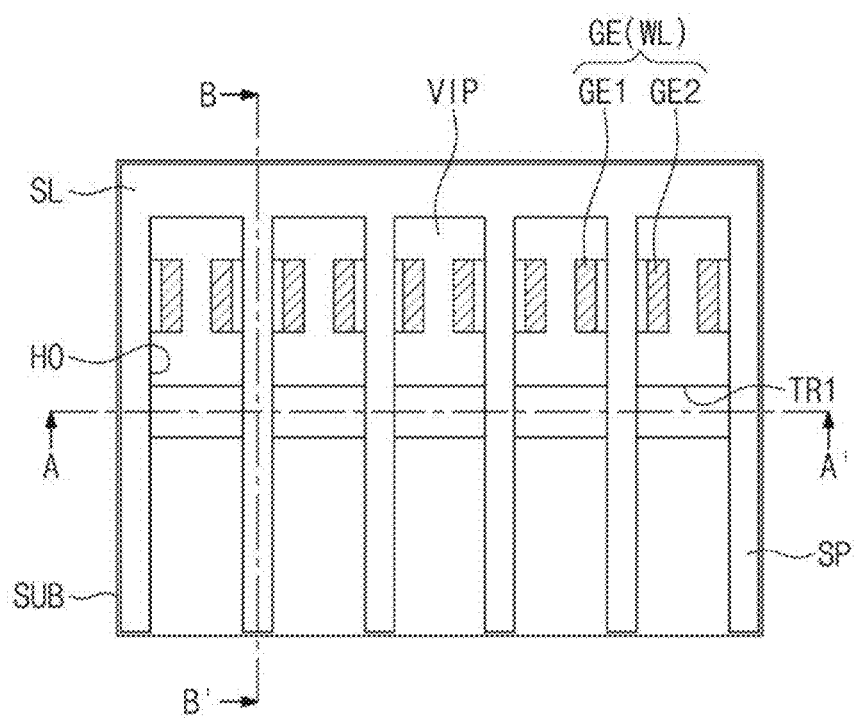
Figure 10A:
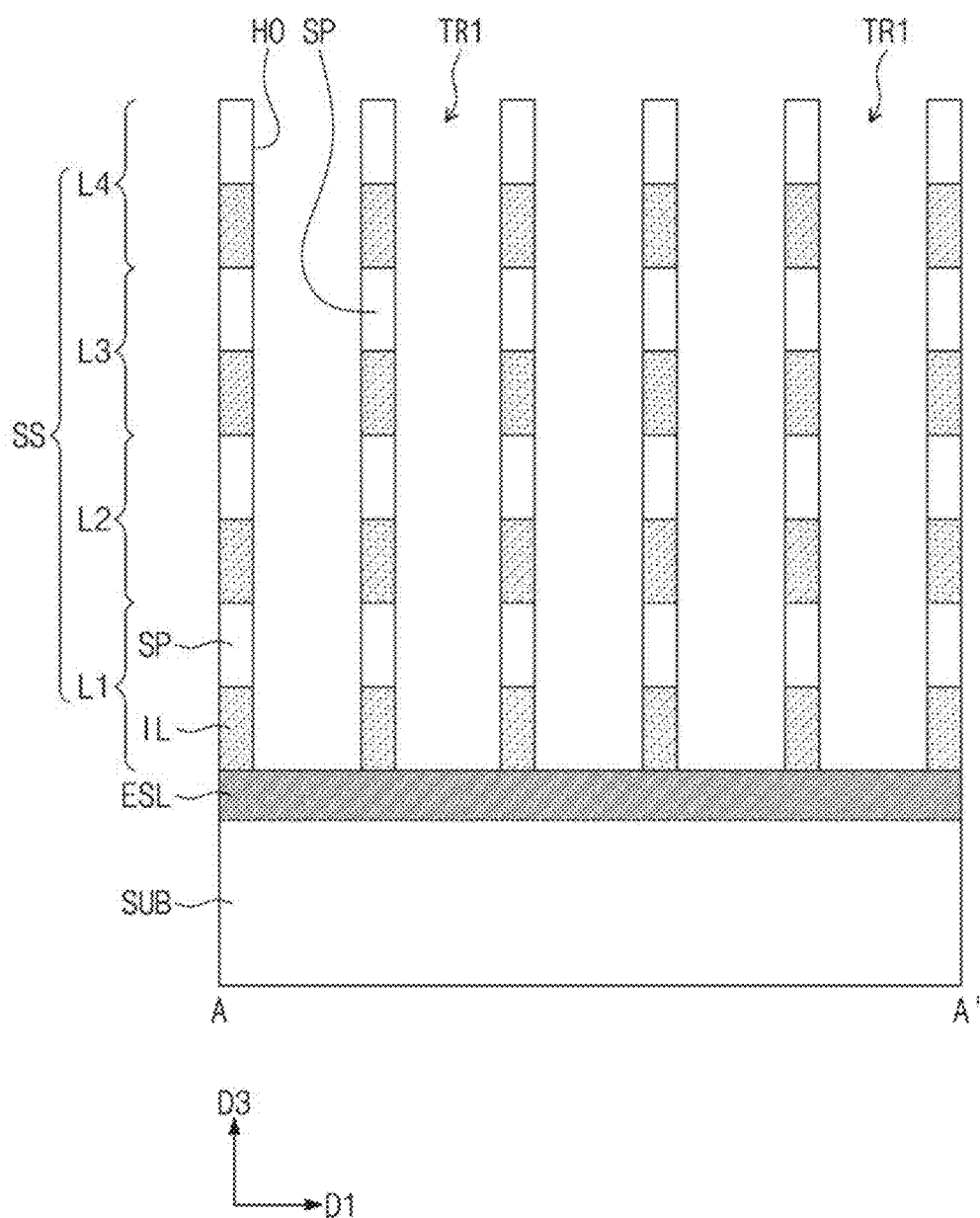
Figure 10B:
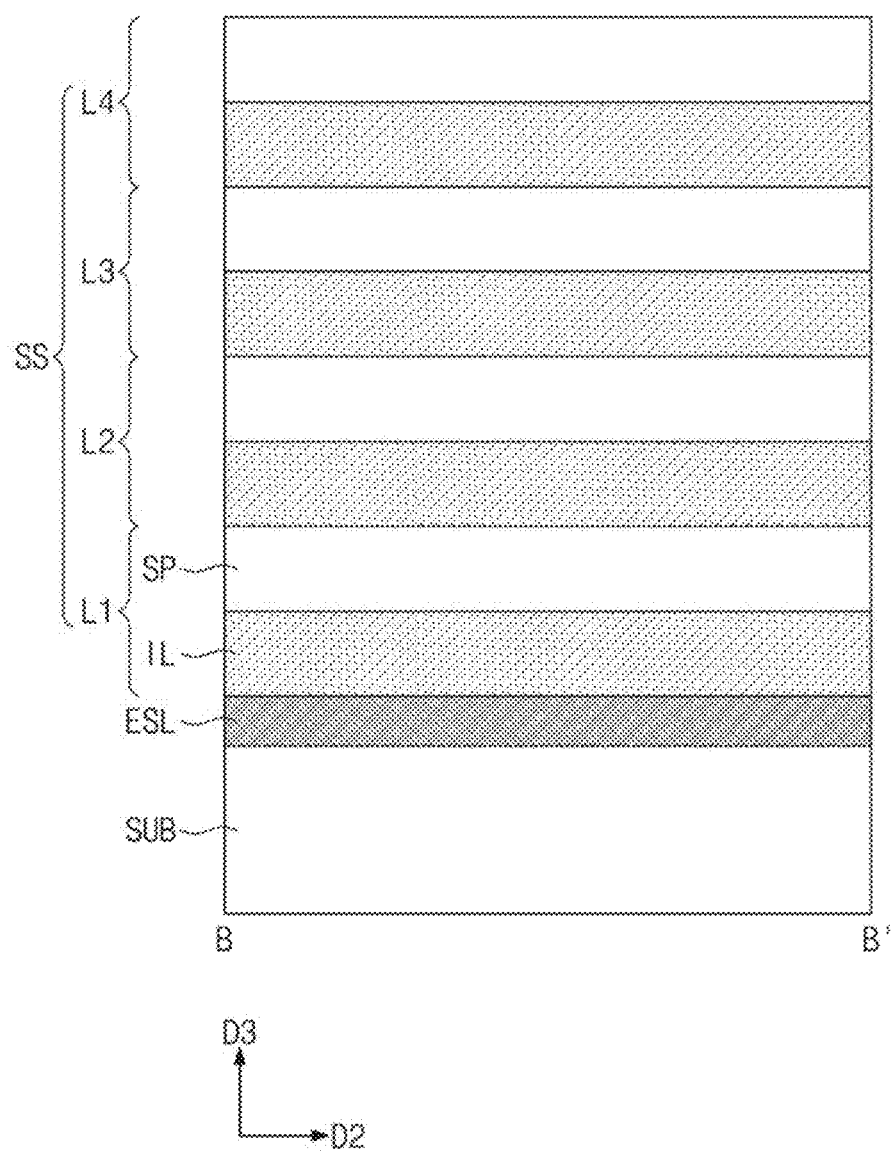

Referring to FIGS. 9, 10A, and 10B, a first trench TR1 may be formed in the stack SS to extend in the first direction D1. In detail, the formation of the first trench TR1 may include forming a mask pattern (not shown) on the stack SS to define the first trench TR1 and selectively etching the vertical insulating layer VIP using the mask pattern as an etch mask. For example, the first trench TR1 may be formed by selectively patterning the vertical insulating layer VIP in the first direction D1.

The semiconductor patterns SP and the insulating layers IL may not be etched, when the first trench TR1 is formed. In certain example embodiments, a portion of the semiconductor pattern SP may be exposed through the first trench TR1.

Figure 11:
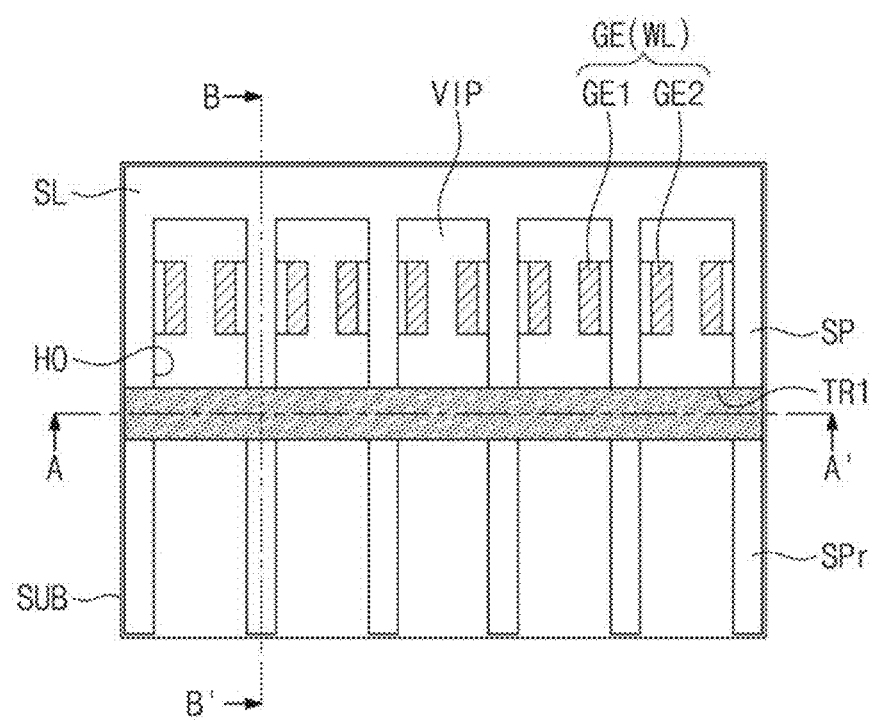
Figure 11:
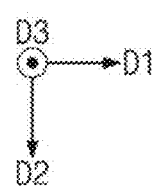
Figure 12A:
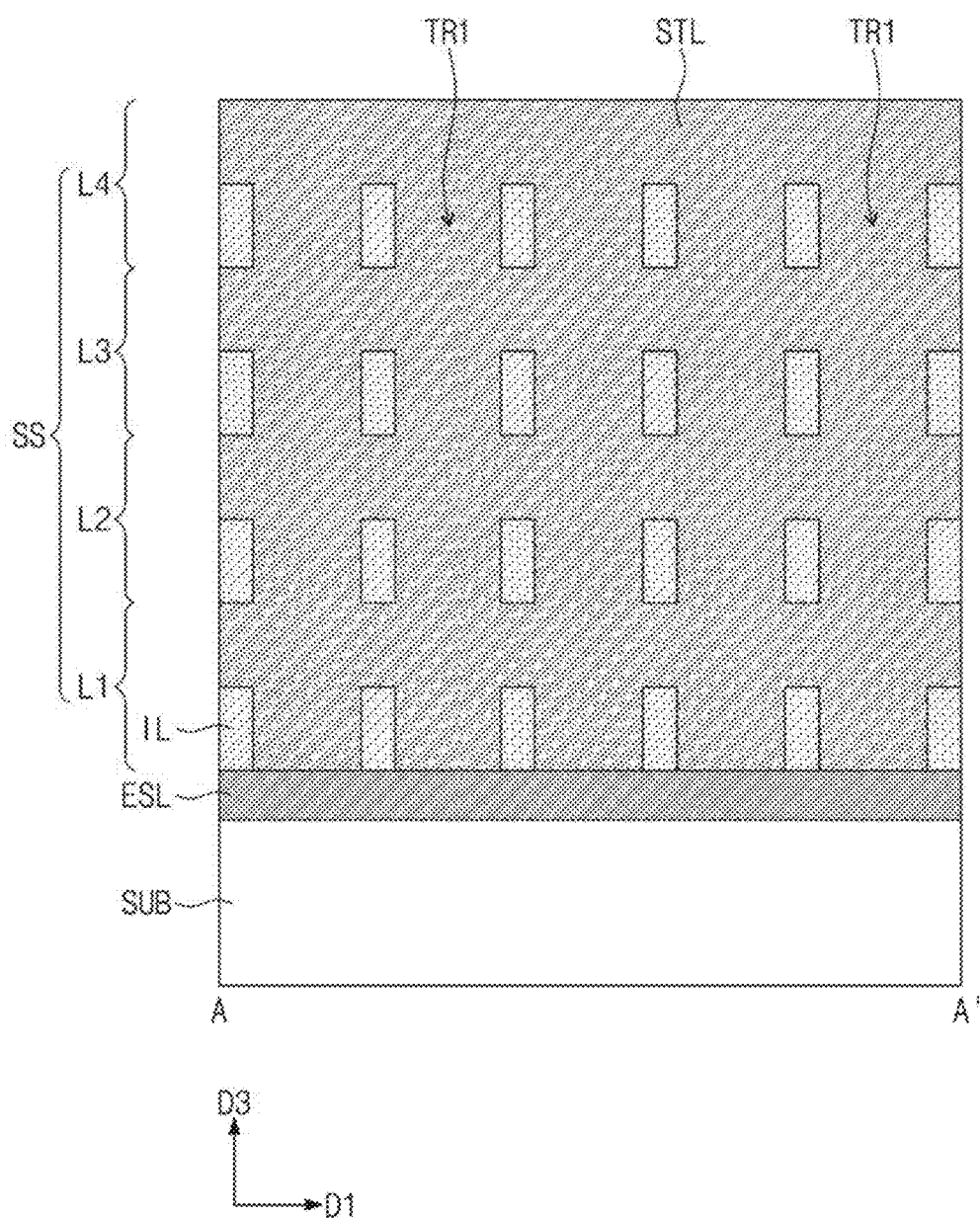
Figure 12B:
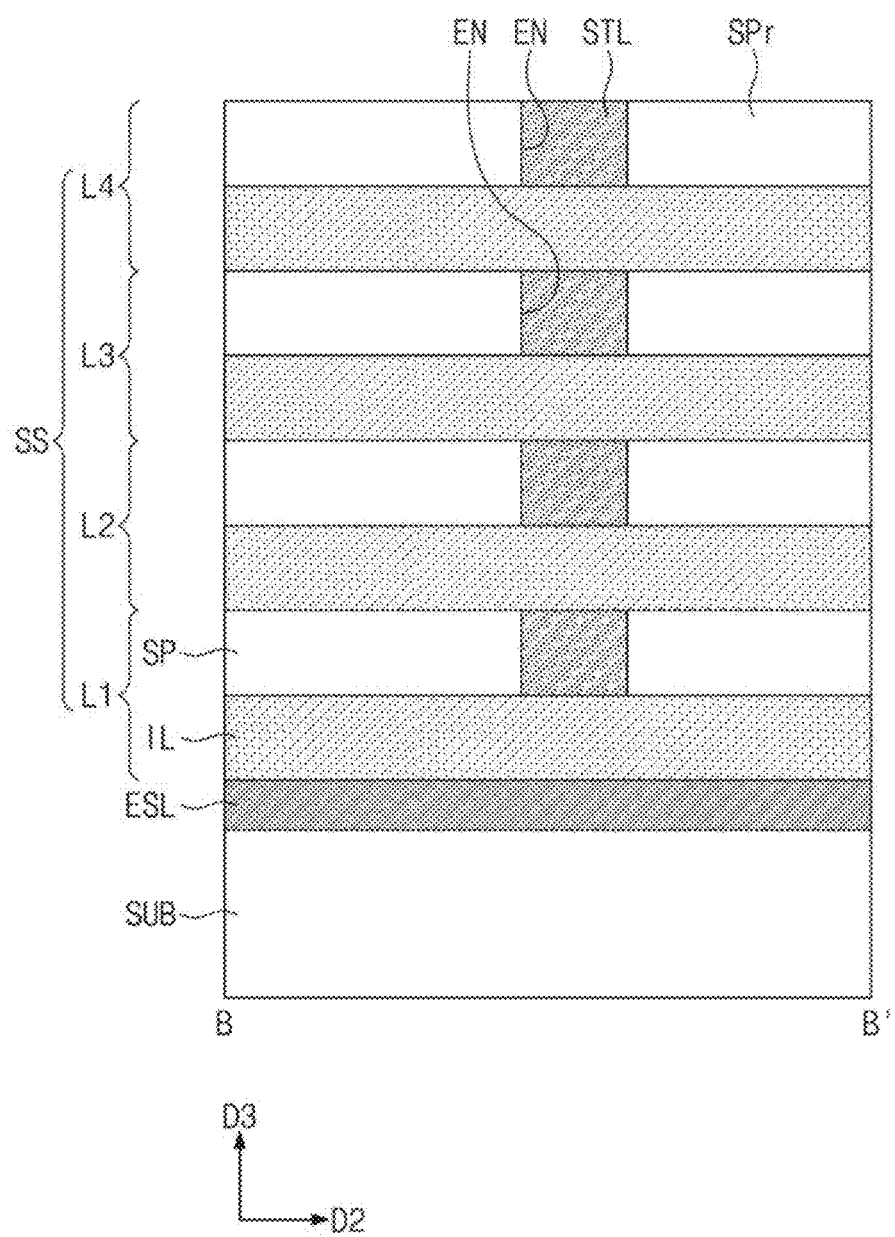

Referring to FIGS. 11, 12A, and 12B, the exposed portions of the semiconductor patterns SP may be selectively removed. In other words, the portion of the semiconductor pattern SP exposed through the first trench TR1 may be selectively removed. Since the portion of the semiconductor pattern SP is removed, a remaining semiconductor pattern SPr, which is spaced apart from the semiconductor pattern SP, may be formed, in addition to the semiconductor pattern SP. The remaining semiconductor pattern SPr may be spaced apart from the semiconductor pattern SP in the second direction D2.

Since a portion of each of the semiconductor patterns SP exposed by the first trench TR1 is removed, end portions EN of the final semiconductor patterns SP may be aligned to each other in the third direction D3. In other words, the semiconductor patterns SP may have substantially the same length.

The stopper layer STL may be formed to fill the first trench TR1. The stopper layer STL may fill a region, from which the semiconductor pattern SP is removed. In other words, the stopper layer STL may be interposed between the semiconductor pattern SP and the remaining semiconductor pattern SPr.

In the fabrication method according to some example embodiments of the inventive concepts, by forming the stopper layer STL, it may be possible to vertically align the end portions EN of the stacked semiconductor patterns SP to each other. In other words, the formation of the stopper layer STL may make it possible to improve the uniformity in length of the stacked semiconductor patterns SP.

Figure 13:
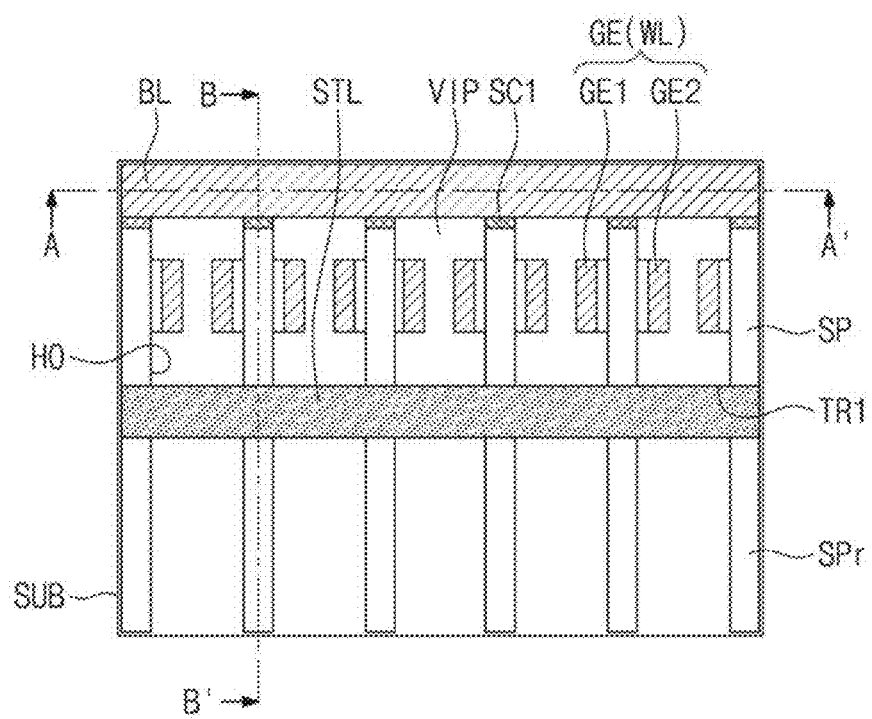
Figure 13:
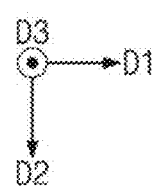
Figure 14A:
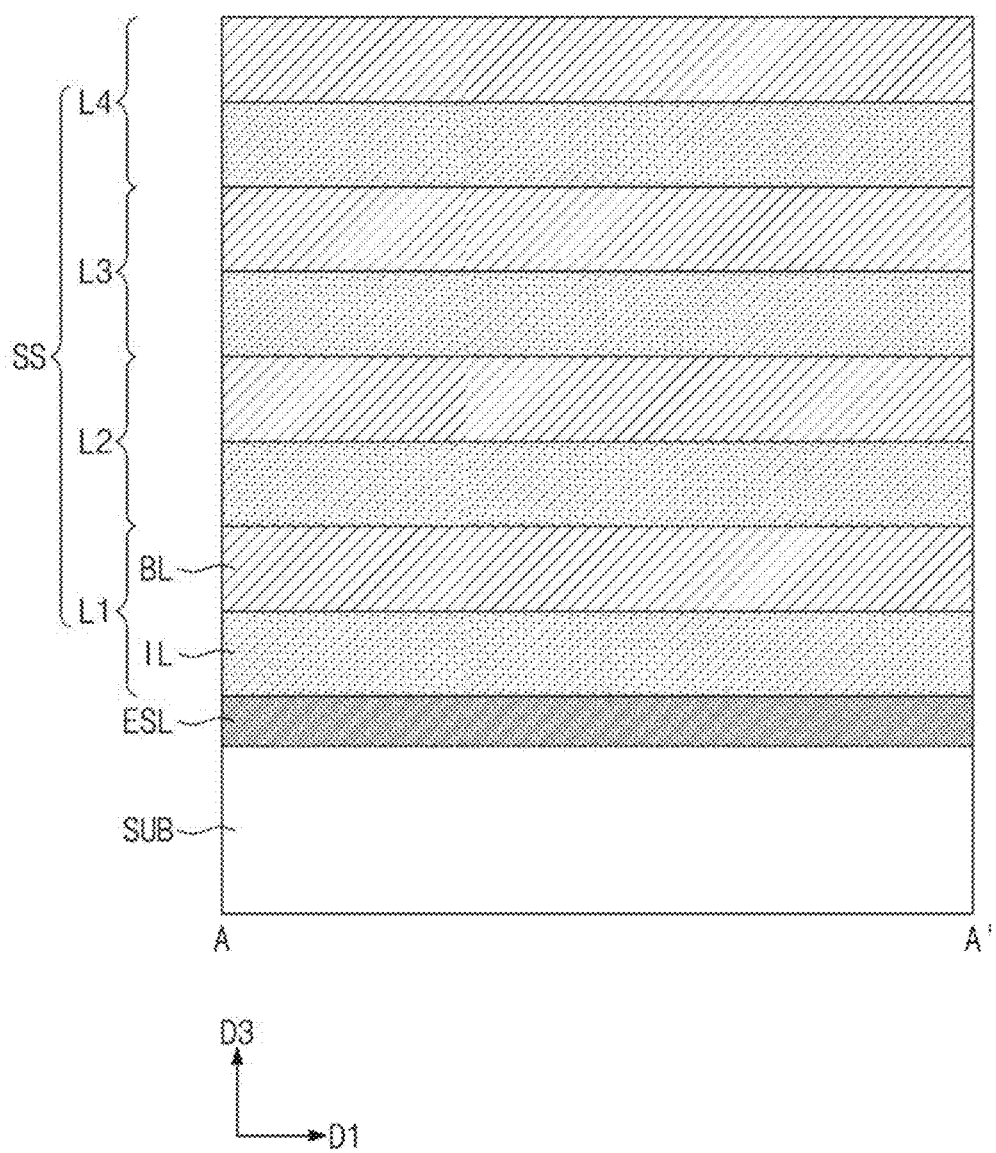
Figure 14B:
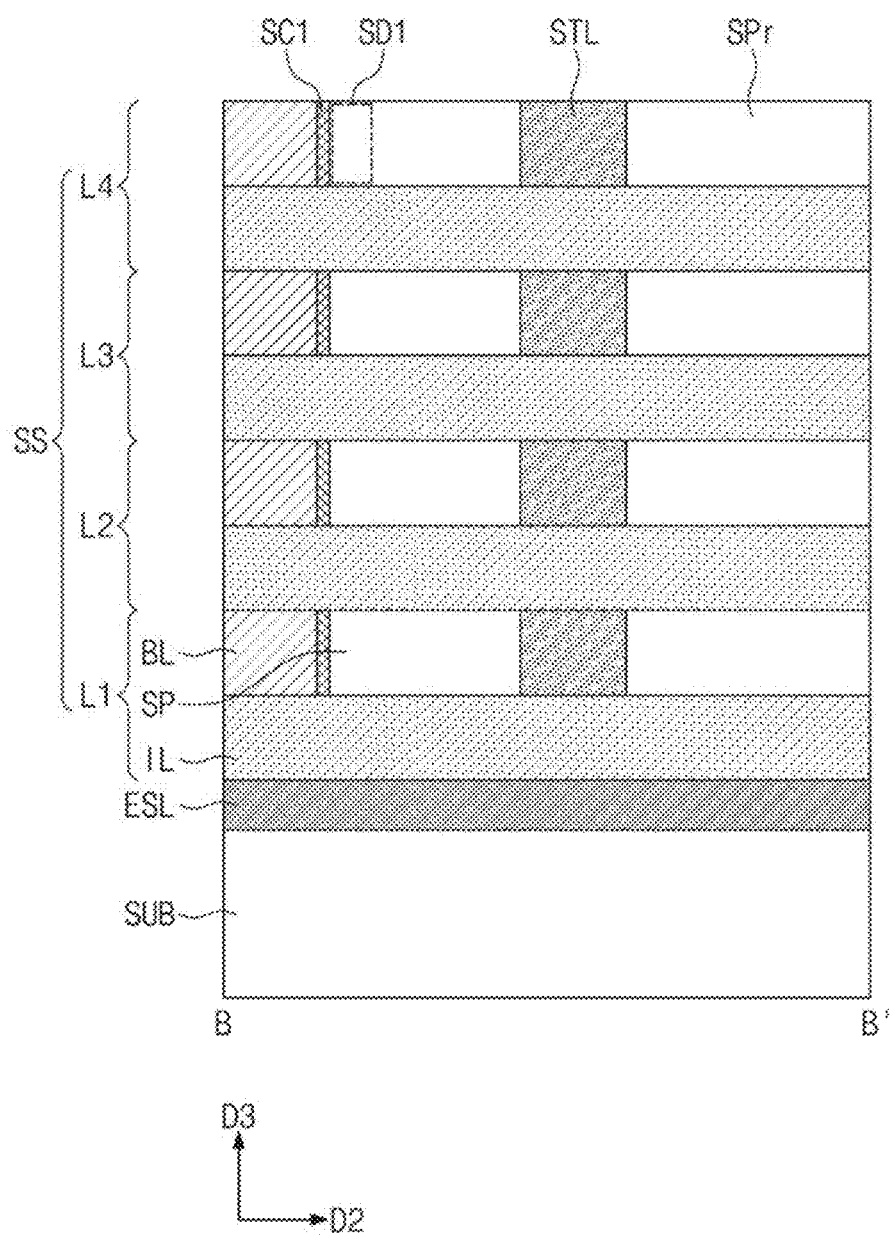

Referring to FIGS. 13, 14A, and 14B, a portion of the semiconductor layer SL, except for the semiconductor patterns SP, may be replaced with the bit line BL. For example, a wet etching process may be performed on a side surface of the stack SS to selectively etch the semiconductor layer SL. The portion of the semiconductor layer SL may be removed by the etching process. The bit line BL may be formed by depositing a conductive material to fill the region, from which the portion of the semiconductor layer SL is removed.

The bit line BL may be extended in the first direction D1. The bit line BL may be electrically connected to the semiconductor patterns SP.

The first silicide pattern SC1 may be formed between the bit line BL and each of the semiconductor patterns SP. The formation of the first silicide pattern SC1 may include performing a silicidation process on the semiconductor patterns SP, which are exposed by removing the portion of the semiconductor layer SL, before the formation of the bit line BL.

The first impurity regions SD1 may be formed in the semiconductor patterns SP, respectively. The formation of the first impurity region SD1 may include injecting impurities into the semiconductor patterns SP, which are exposed by removing the portion of the semiconductor layer SL, before the formation of the bit line BL.

Figure 15:
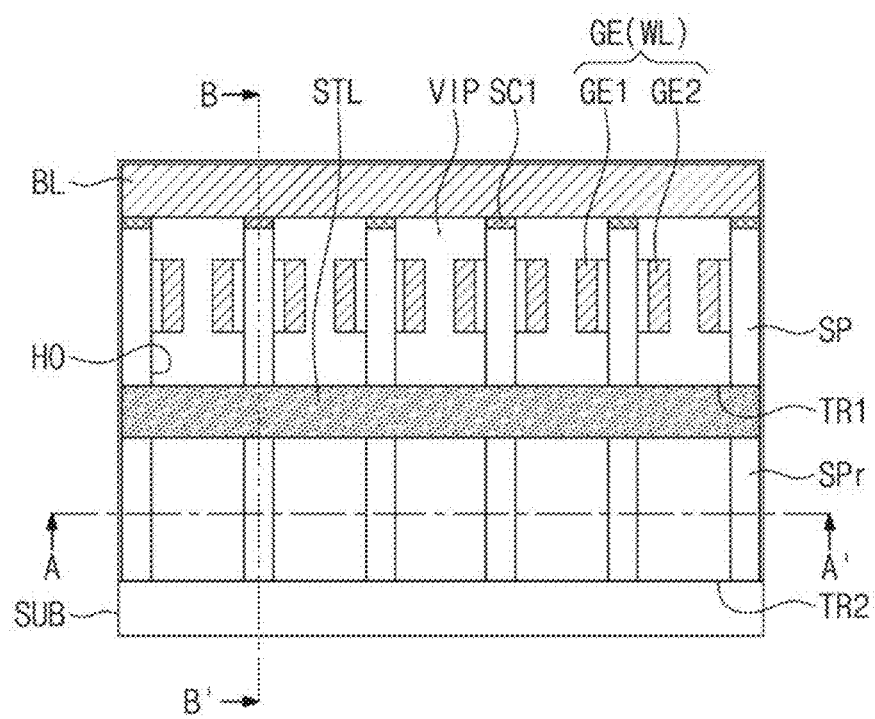
Figure 15:
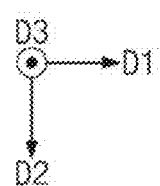
Figure 16A:
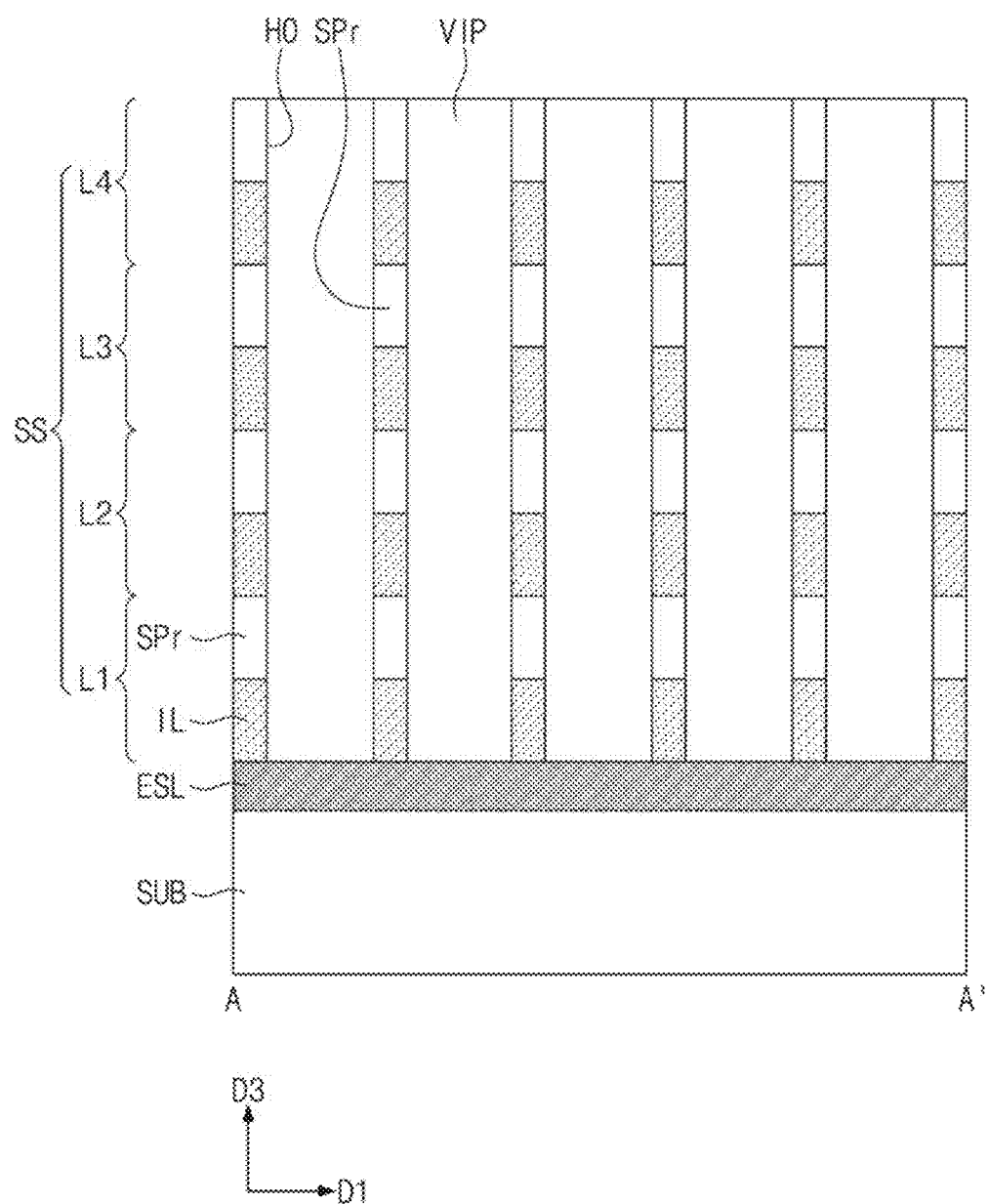
Figure 16B:
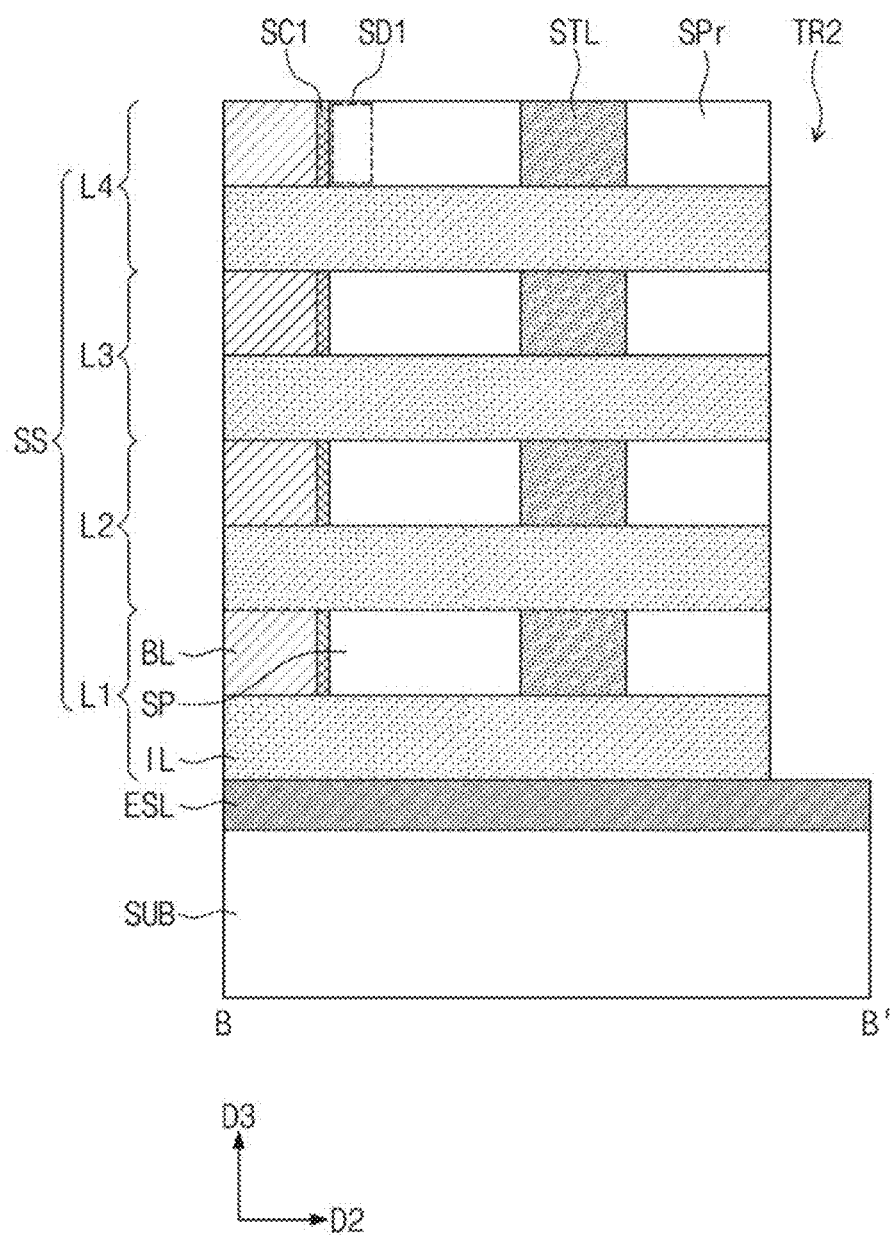

Referring to FIGS. 15, 16A, and 16B, the stack SS may be patterned to form a second trench TR2 penetrating the stack SS. The second trench TR2 may be formed to expose side surfaces of the remaining semiconductor patterns SPr, side surfaces of the insulating layers IL, and a side surface of the vertical insulating layer VIP. The second trench TR2 may be extended in the first direction D1.

Figure 17:
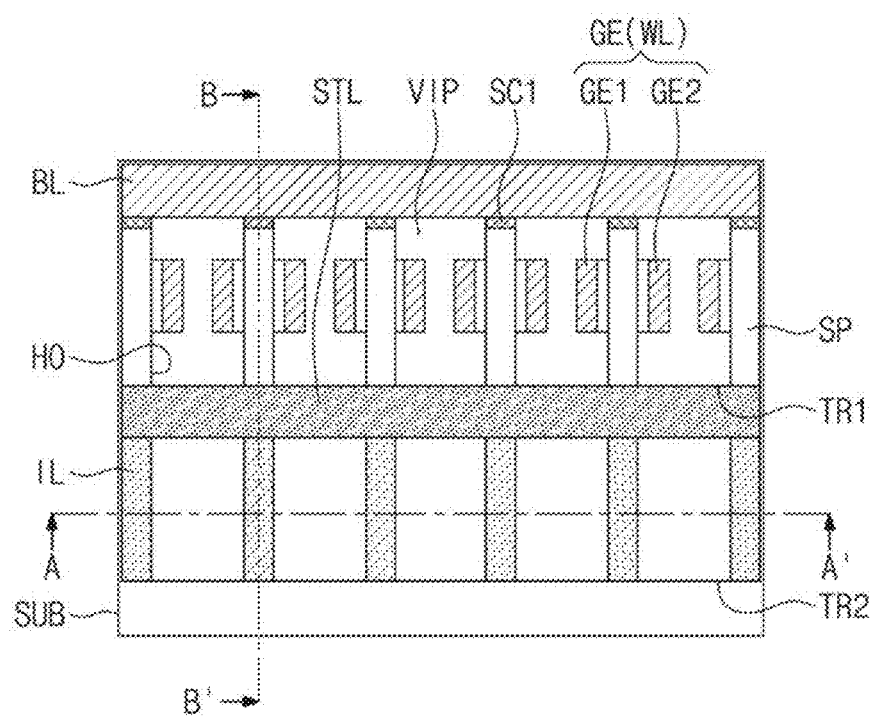
Figure 17:
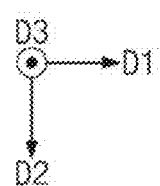
Figure 18A:
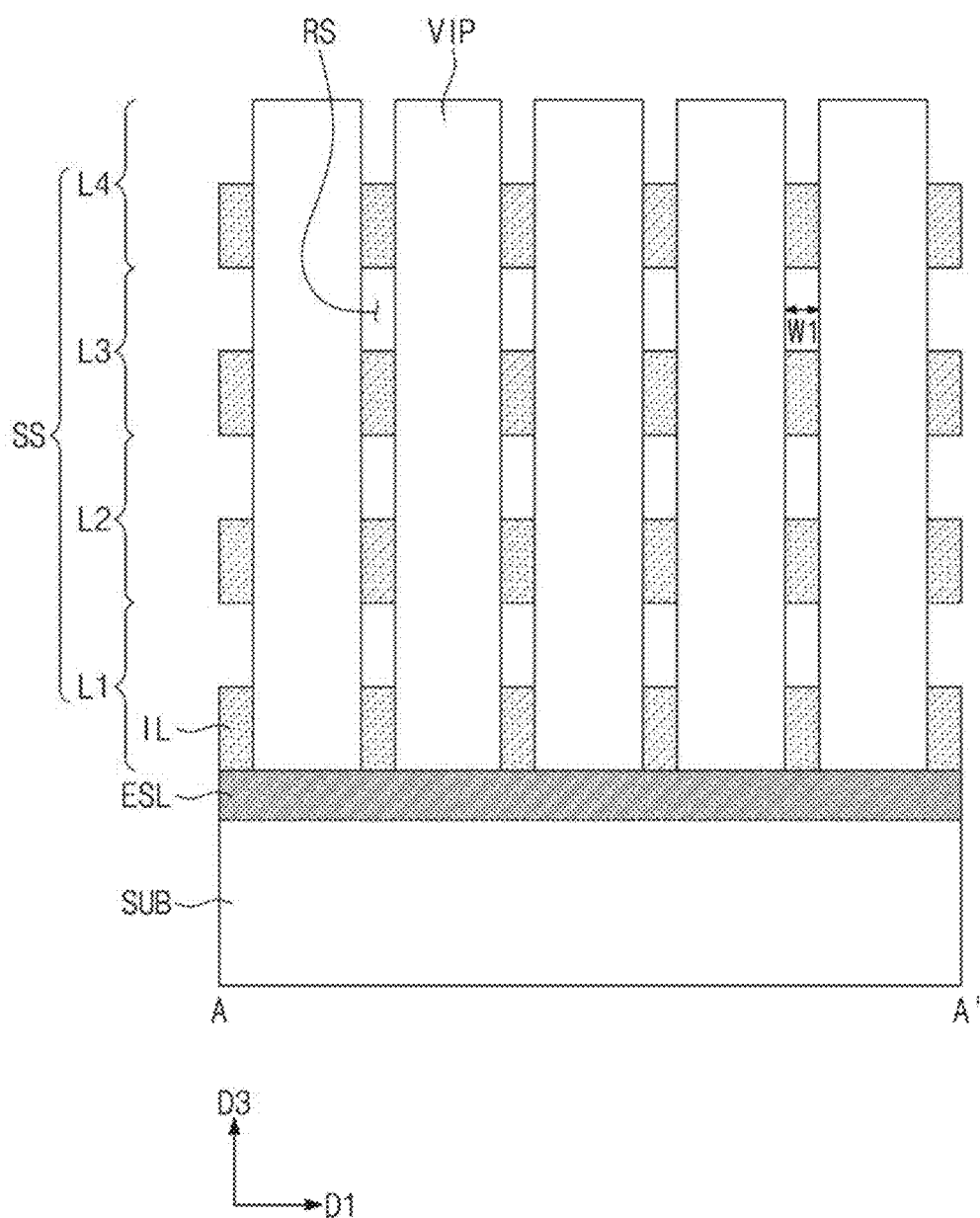
Figure 18B:
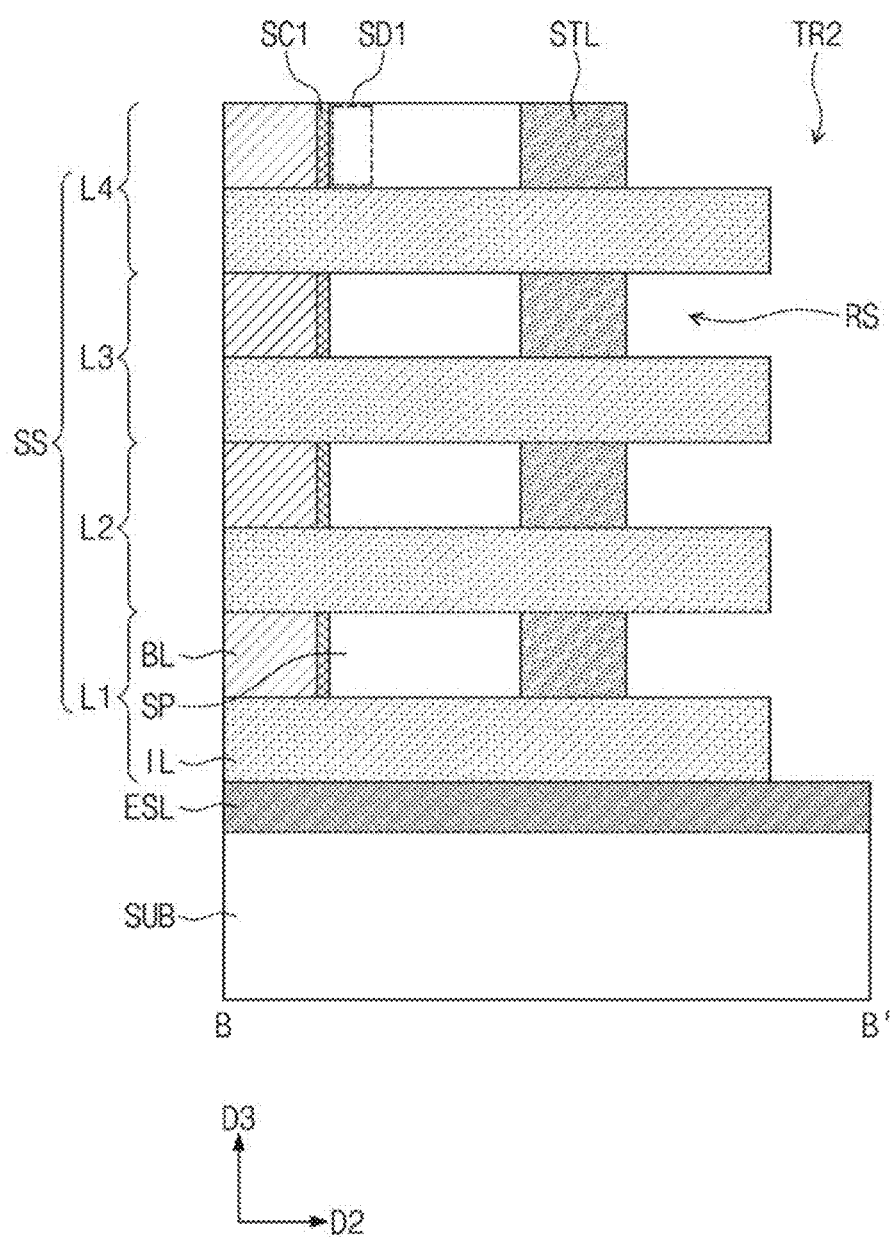

Referring to FIGS. 17, 18A, and 18B, the remaining semiconductor patterns SPr exposed through the second trench TR2 may be removed to form recesses RS. The formation of the recesses RS may include performing a wet etching process to selectively etch the remaining semiconductor patterns SPr through the second trench TR2. The wet etching process may be performed to completely remove the remaining semiconductor pattern SPr and to expose the stopper layer STL.

The recesses RS may be horizontally extended from the second trench TR2 toward the bit lines BL. The recess RS may be surrounded by the insulating layers IL, the stopper layer STL, and the vertical insulating layer VIP. The recess RS may have the first width W1 in the first direction D1.

Figure 19:
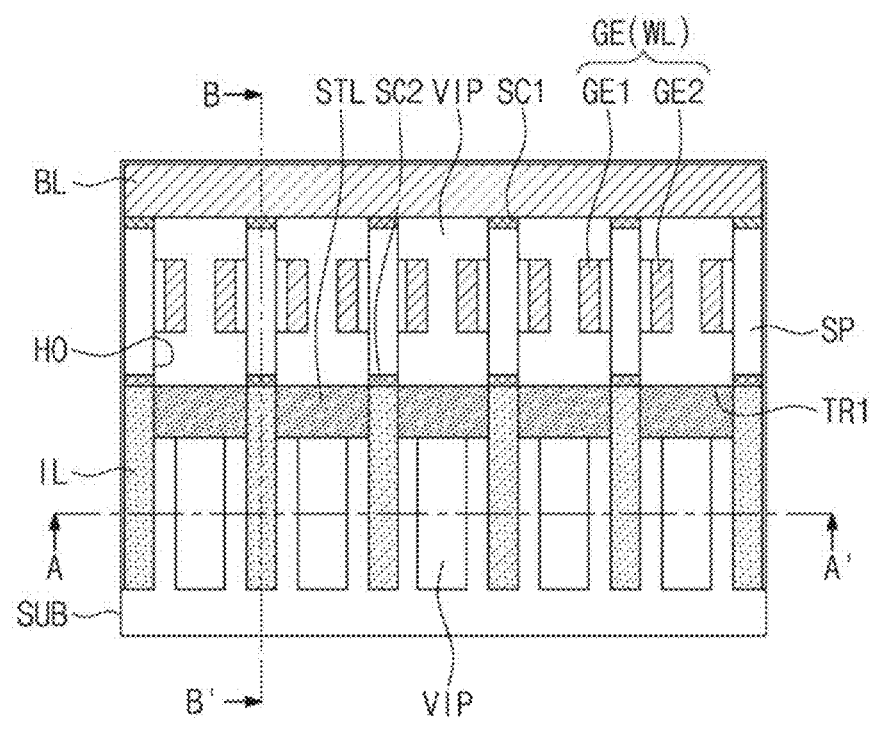
Figure 19:
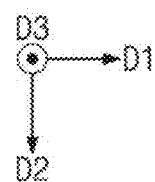
Figure 20A:
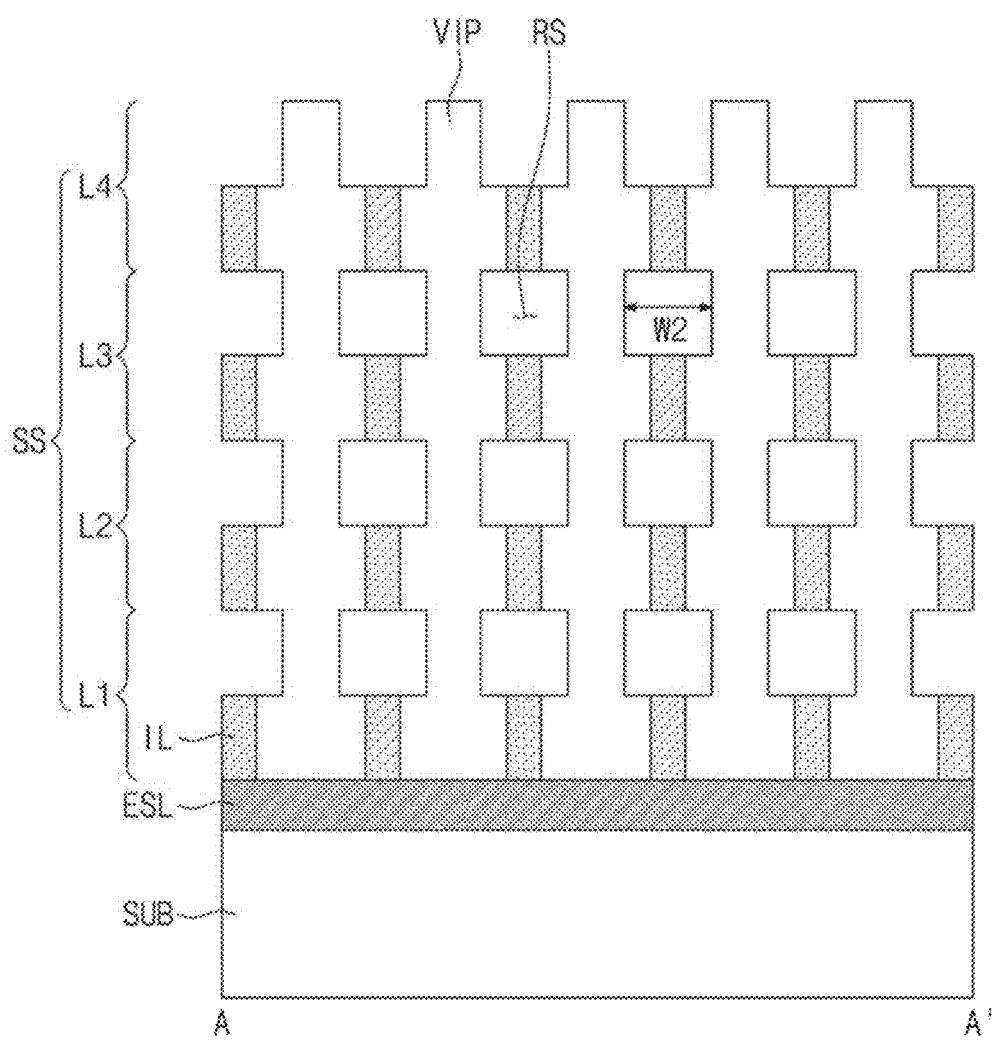
Figure 20B:
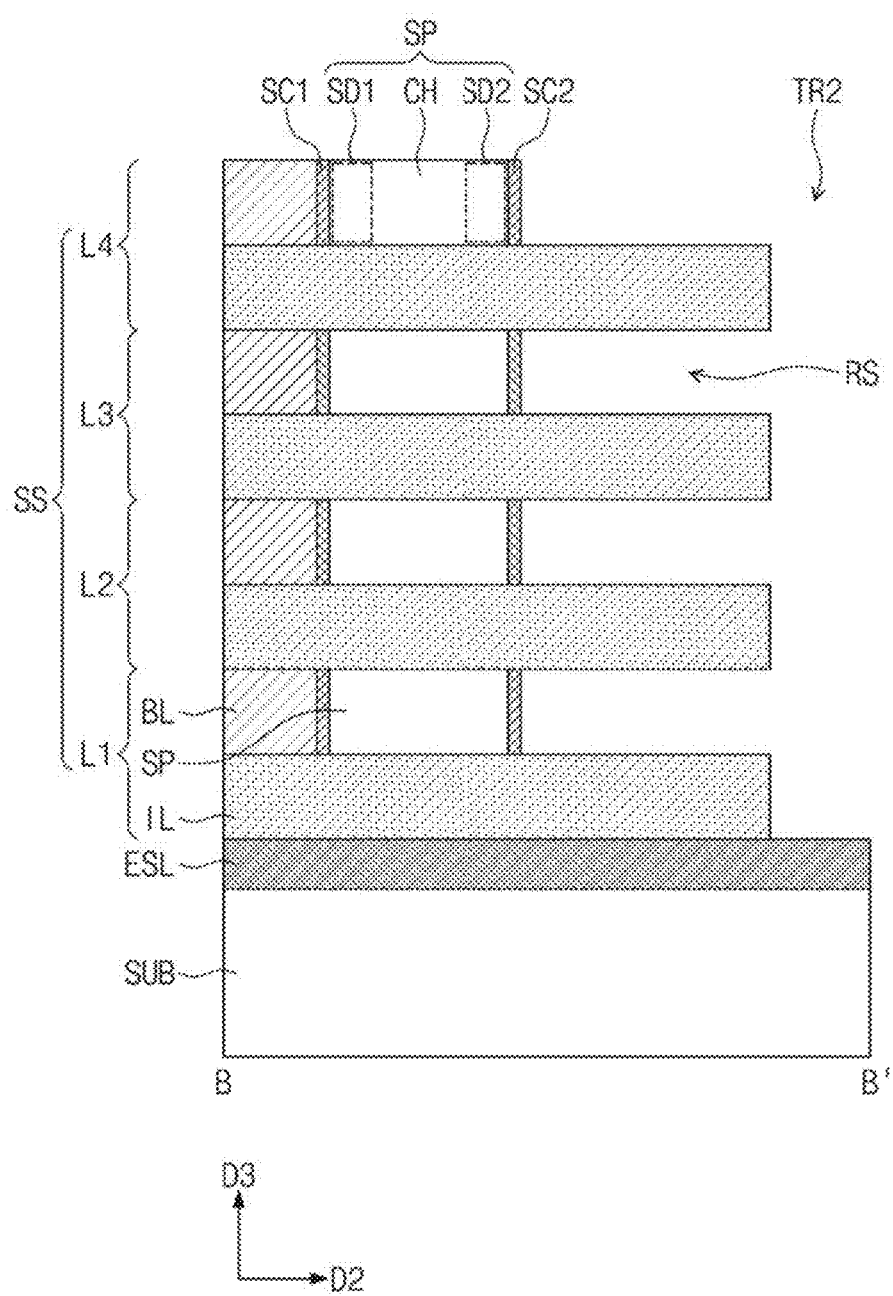

Referring to FIGS. 19, 20A, and 20B, the stopper layer STL exposed through the recess RS may be selectively etched. Accordingly, an end portion of the semiconductor pattern SP may be exposed through the recess RS. The exposed end portion of the semiconductor pattern SP may be doped with impurities to form the second impurity region SD2. A silicidation process may be performed on the exposed end portion of the semiconductor pattern SP to form the second silicide pattern SC2.

Next, the vertical insulating layer VIP may be selectively etched through the recess RS to expand the recess RS in the first direction D1. Since the vertical insulating layer VIP is selectively etched, a portion of the vertical insulating layer VIP adjacent to the recess RS may be removed. The recess RS may be expanded to have the second width W2 in the first direction D1. The second width W2 may be greater than the first width W1 in FIG. 18A.

Figure 21:
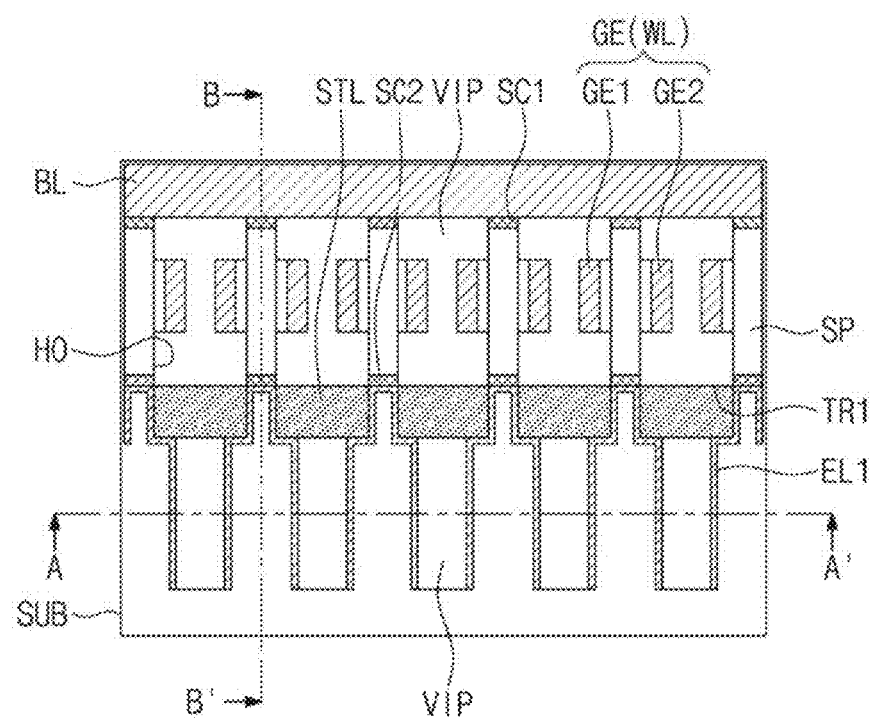
Figure 21:
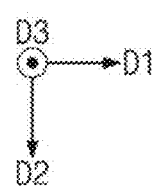
Figure 22A:
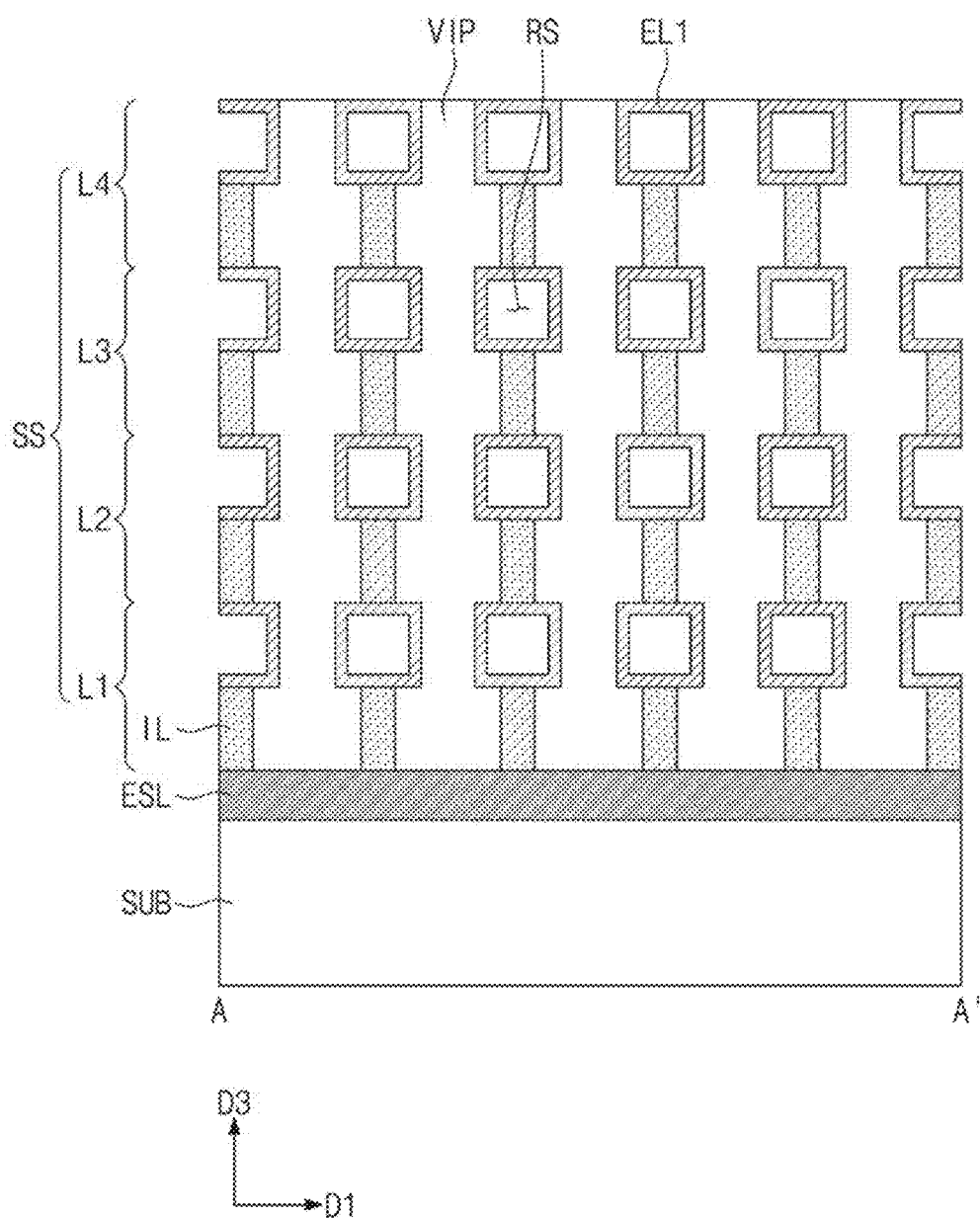
Figure 22B:
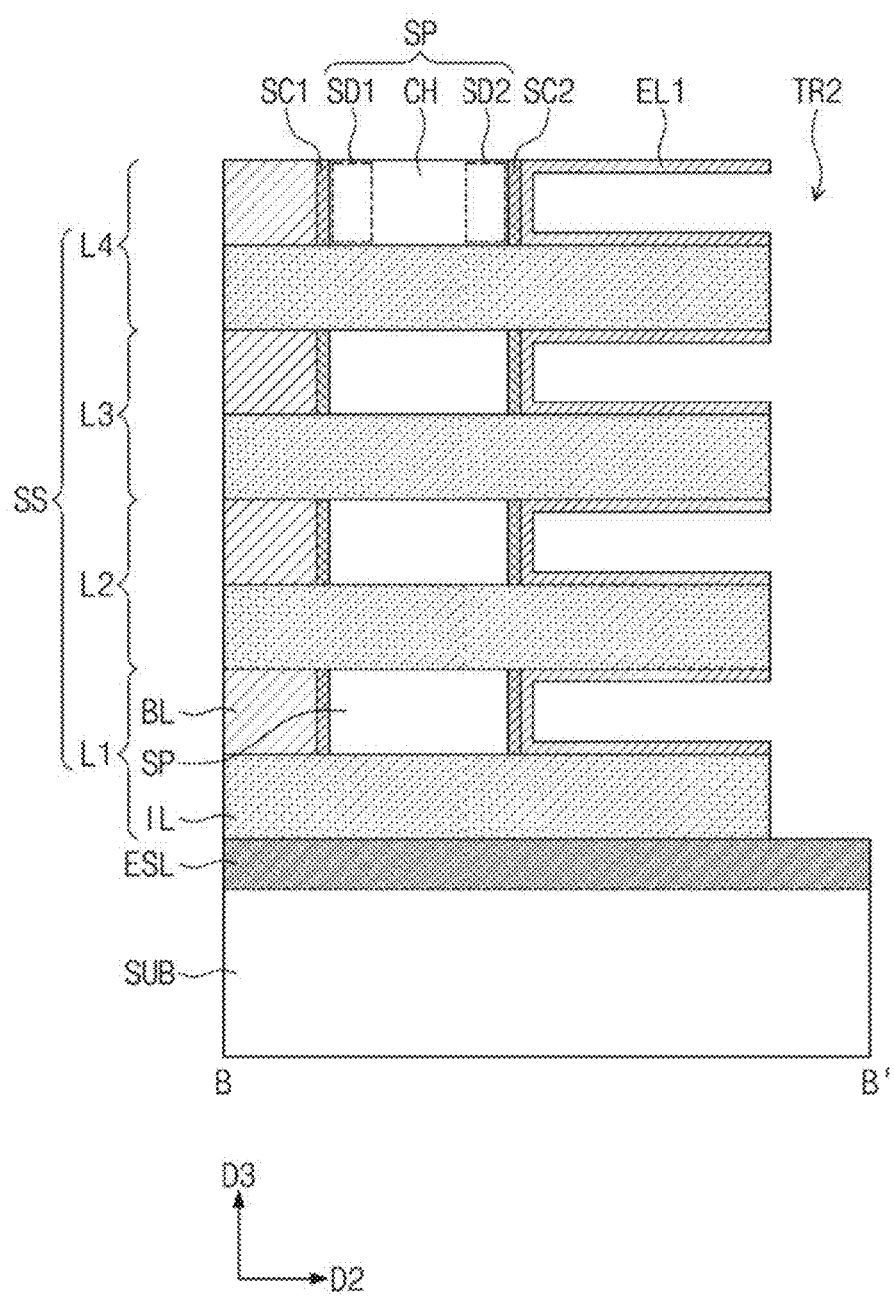

Referring to FIGS. 21, 22A, and 22B, the first electrodes EL1 may be formed in the recesses RS, respectively. In detail, the formation of the first electrodes EL1 may include conformally forming a first electrode layer in the recesses RS and performing a wet etching process on the first electrode layer to form a plurality of the first electrodes EL1 separated from each other. Accordingly, the first electrode EL1 may be formed to have a cylinder-shape with an opened end portion.

Referring back to FIGS. 3 and 4A to 4E, the dielectric layer DL may be conformally formed on the first electrodes EL1. The dielectric layer DL may cover the exposed surface of the first electrode EL1. The second electrode EL2 may be formed on the dielectric layer DL. The second electrode EL2 may be formed to completely fill the second trench TR2 and the recesses RS. The first electrode EL1, the dielectric layer DL, and the second electrode EL2 may include the data storing element DS.

In the fabrication method according to some example embodiments of the inventive concepts, the stopper layer STL may be used to form the recesses RS to substantially the same depth (e.g., lengths of the recesses RS in the second direction D2). The end portions of the stacked semiconductor patterns SP may be exposed through the recesses RS of the same size. Since the first electrodes EL1 are formed in the recesses RS, respectively, the first electrodes EL1 may be formed to have substantially the same size and the same shape. As a result, it may be possible to fabricate a three-dimensional semiconductor memory device with improved electric and reliability characteristics.

Figure 23:
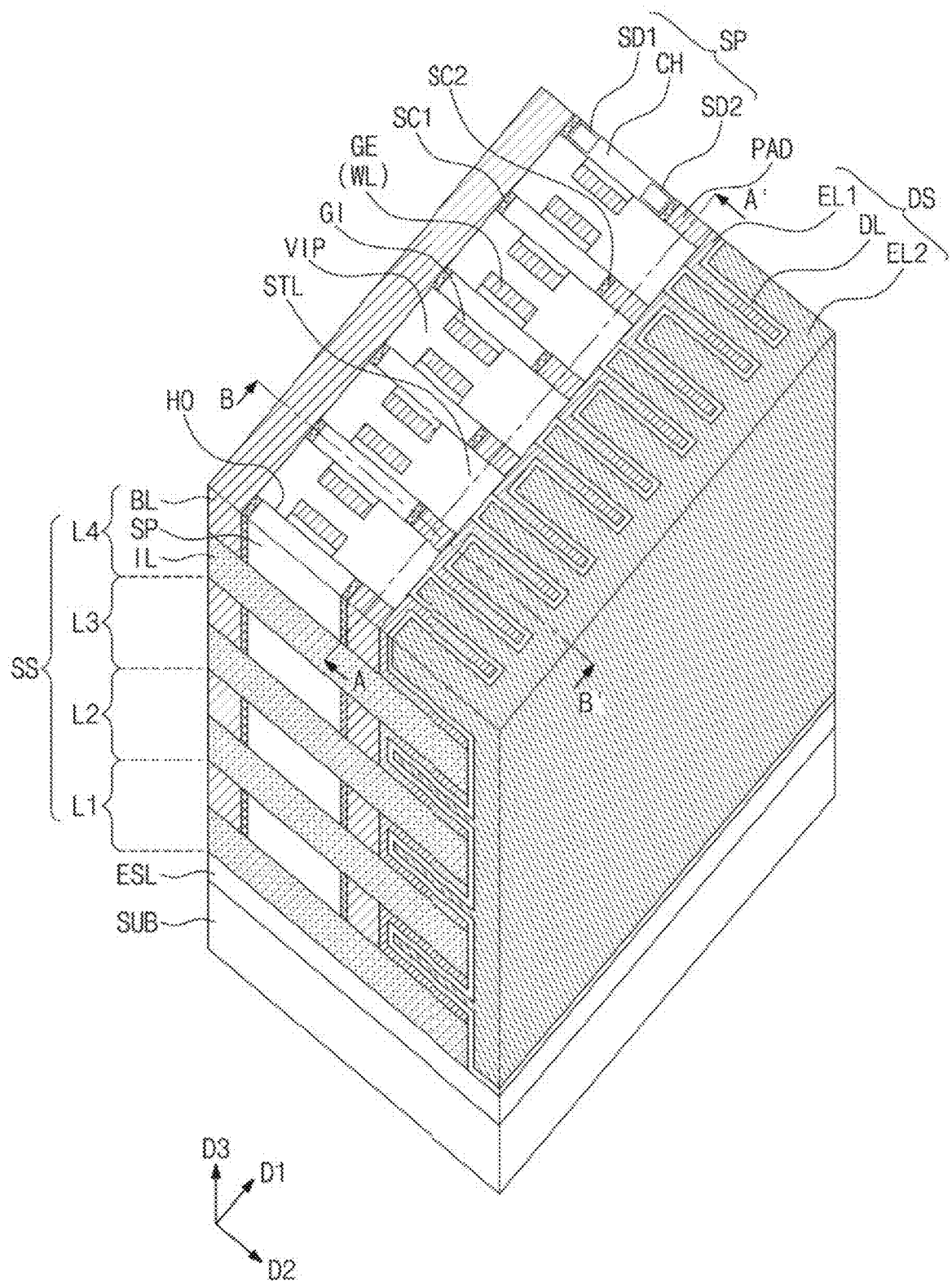
FIG. 23 is a perspective view illustrating a three-dimensional semiconductor memory device according to some example embodiments of the inventive concepts.
Figure 24A:
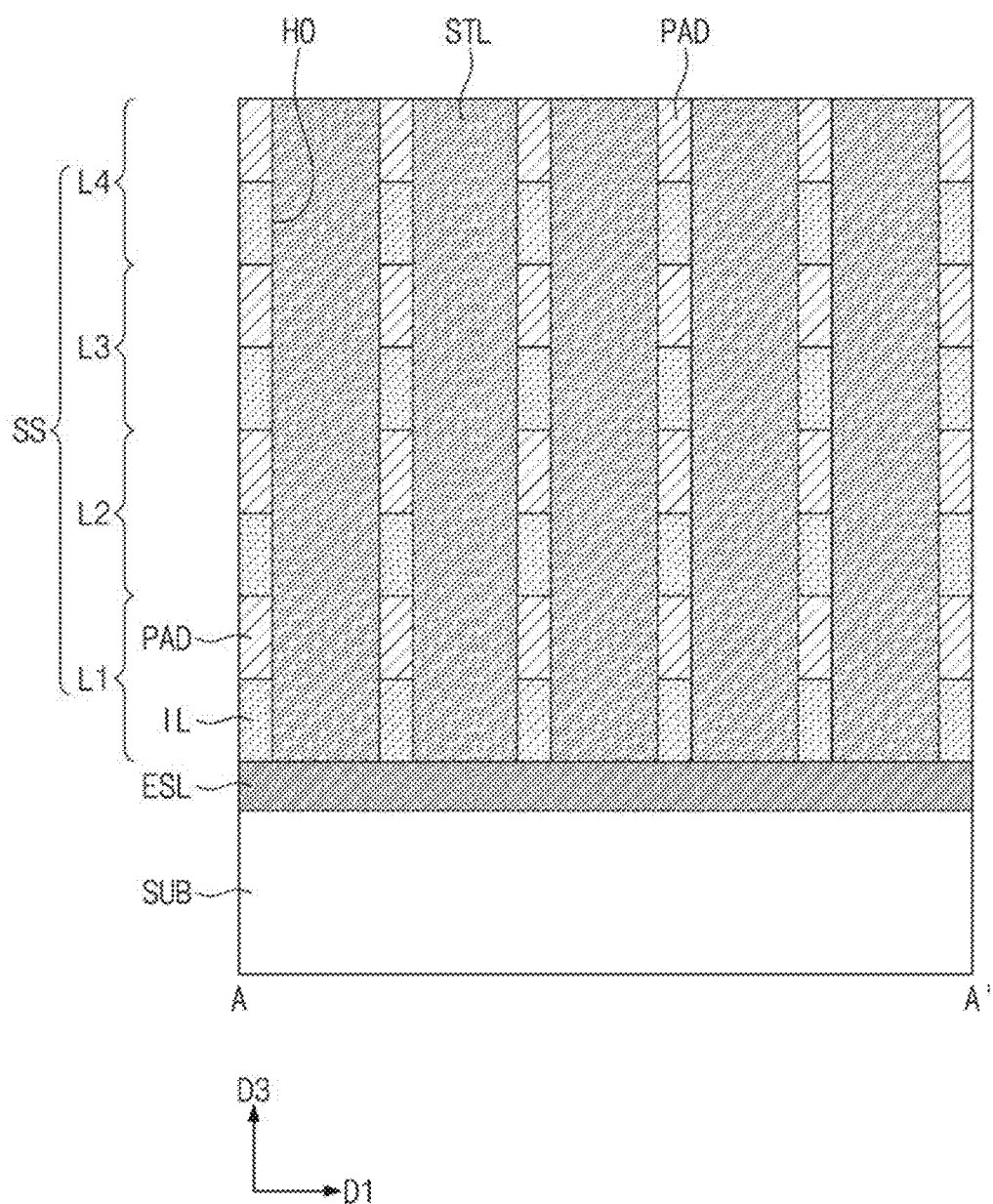
FIGS. 24A and 24B are sectional views taken along lines A-A' and B-B', respectively, of FIG. 23.
Figure 24B:
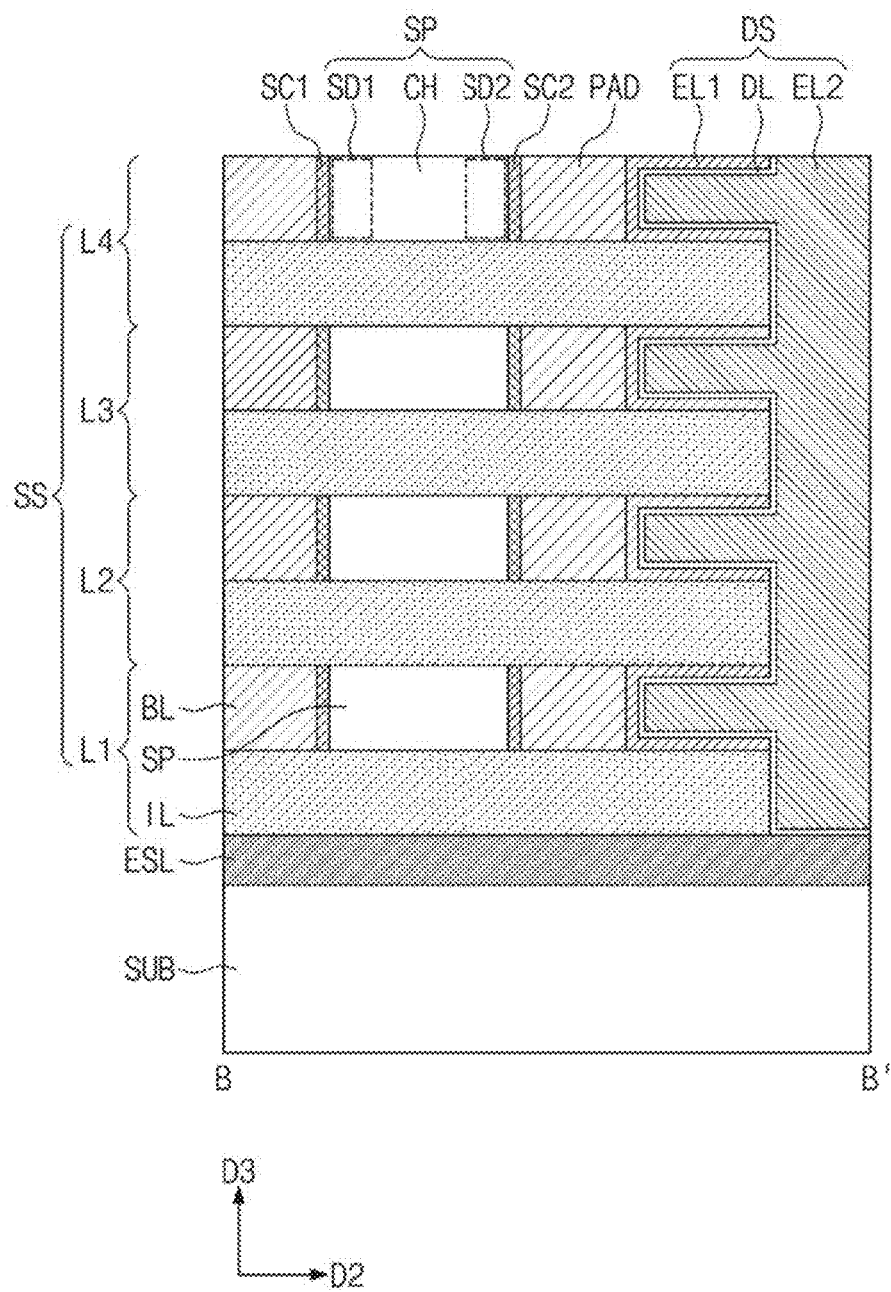

FIG. 23 is a perspective view illustrating a three-dimensional semiconductor memory device according to some example embodiments of the inventive concepts. FIGS. 24A and 24B are sectional views taken along lines A-A' and B-B', respectively, of FIG. 23. For concise description, an element previously described with reference to FIGS. 3 and 4A to 4E will be identified by the same reference number without repeating an overlapping description thereof, and features different from that of the previous embodiment will be described in more detail below.

Referring to FIGS. 23, 24A, and 24B, conductive pads PAD may be respectively interposed between the semiconductor patterns SP and the first electrodes EL1. The conductive pads PAD may be arranged in the first direction D1. Each of the conductive pads PAD may be a bar-shaped pattern extending in the second direction D2. In other words, the conductive pad PAD may be extended parallel to a long axis of the semiconductor pattern SP. The semiconductor pattern SP and the conductive pad PAD may be arranged, in an aligned manner, along the long axis of the semiconductor pattern SP. A width W3 of the conductive pad PAD in the first direction D1 may be substantially equal to a width of the semiconductor pattern SP in the first direction D1.

An end portion of the conductive pad PAD may be in direct contact with the second silicide pattern SC2. An opposite end portion of the conductive pad PAD may be in direct contact with the first electrode EL1. The stopper layer STL may cover opposite side surfaces of the conductive pad PAD. A length of the conductive pad PAD in the second direction D2 may be substantially equal to a width of the stopper layer STL in the second direction D2.

The largest width of the conductive pad PAD in the first direction D1 may be the third width W3. The largest width of the first electrode EL1 in the first direction D1 may be the second width W2. The second width W2 may be greater than the third width W3. The conductive pad PAD may be formed of or include at least one of metallic materials and/or conductive metal nitrides.

FIGS. 25, 27, 29, 31, and 33 are plan views illustrating a method of fabricating a three-dimensional semiconductor memory device, according to some example embodiments of the inventive concepts. FIGS. 26A, 28A, 30A, 32A, and 34A are sectional views taken along lines A-A' of FIGS. 25, 27, 29, 31, and 33, respectively. FIGS. 26B, 28B, 30B, 32B, and 34B are sectional views taken along lines B-B' of FIGS. 25, 27, 29, 31, and 33. For concise description, an element previously described with reference to FIGS. 5 to 22B will be identified by the same reference number without repeating an overlapping description thereof, and features different from that of the previous embodiment will be described in more detail below.

Figure 25:
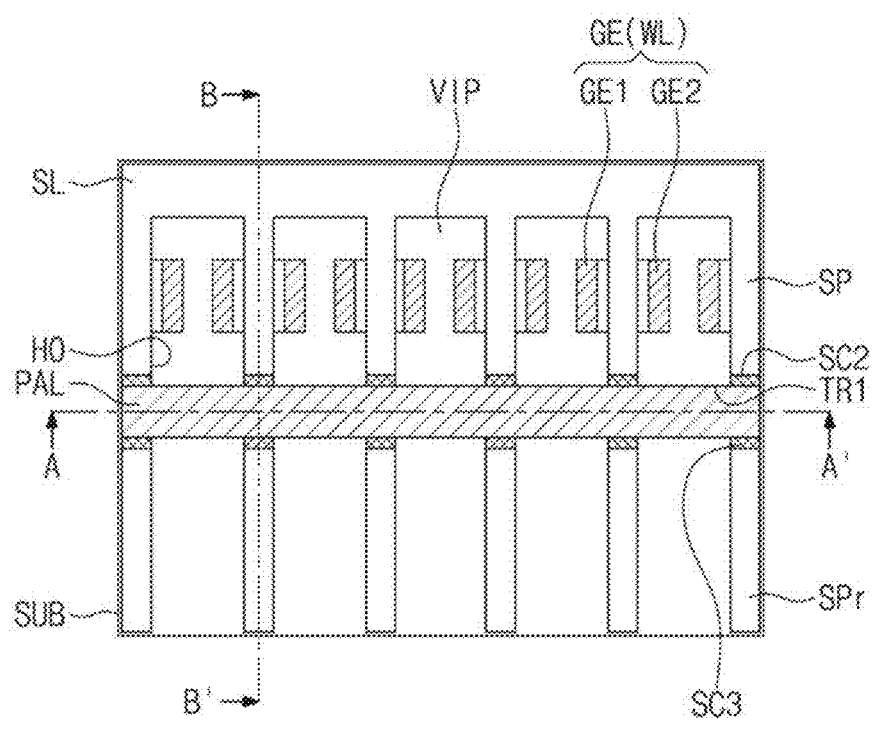
FIGS. 25, 27, 29, 31, and 33 are plan views illustrating a method of fabricating a three-dimensional semiconductor memory device, according to some example embodiments of the inventive concepts.
Figure 25:
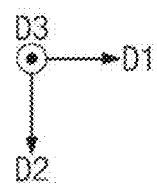
Figure 26A:
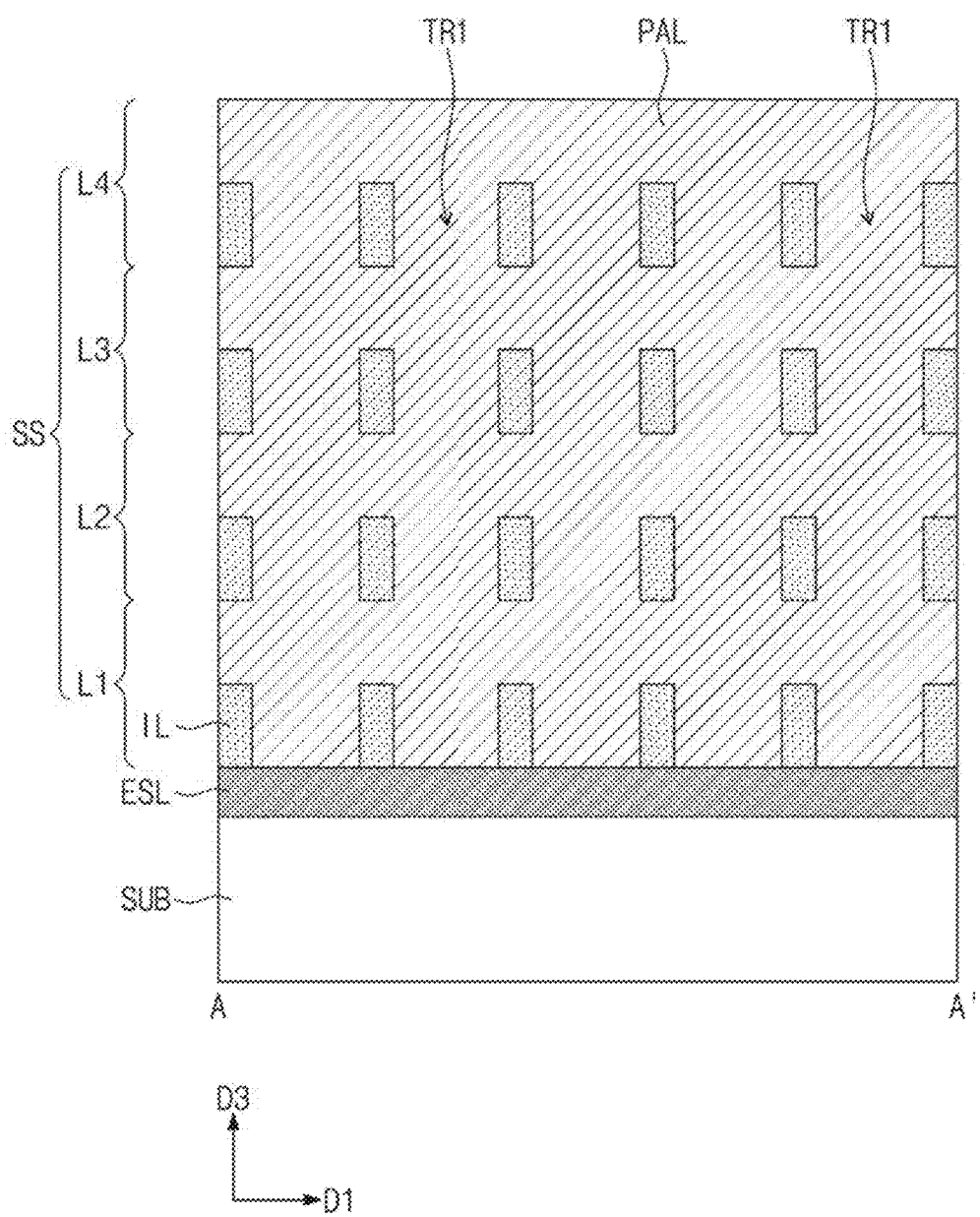
FIGS. 26A, 28A, 30A, 32A, and 34A are sectional views taken along lines A-A' of FIGS. 25, 27, 29, 31, and 33, respectively.
Figure 26B:
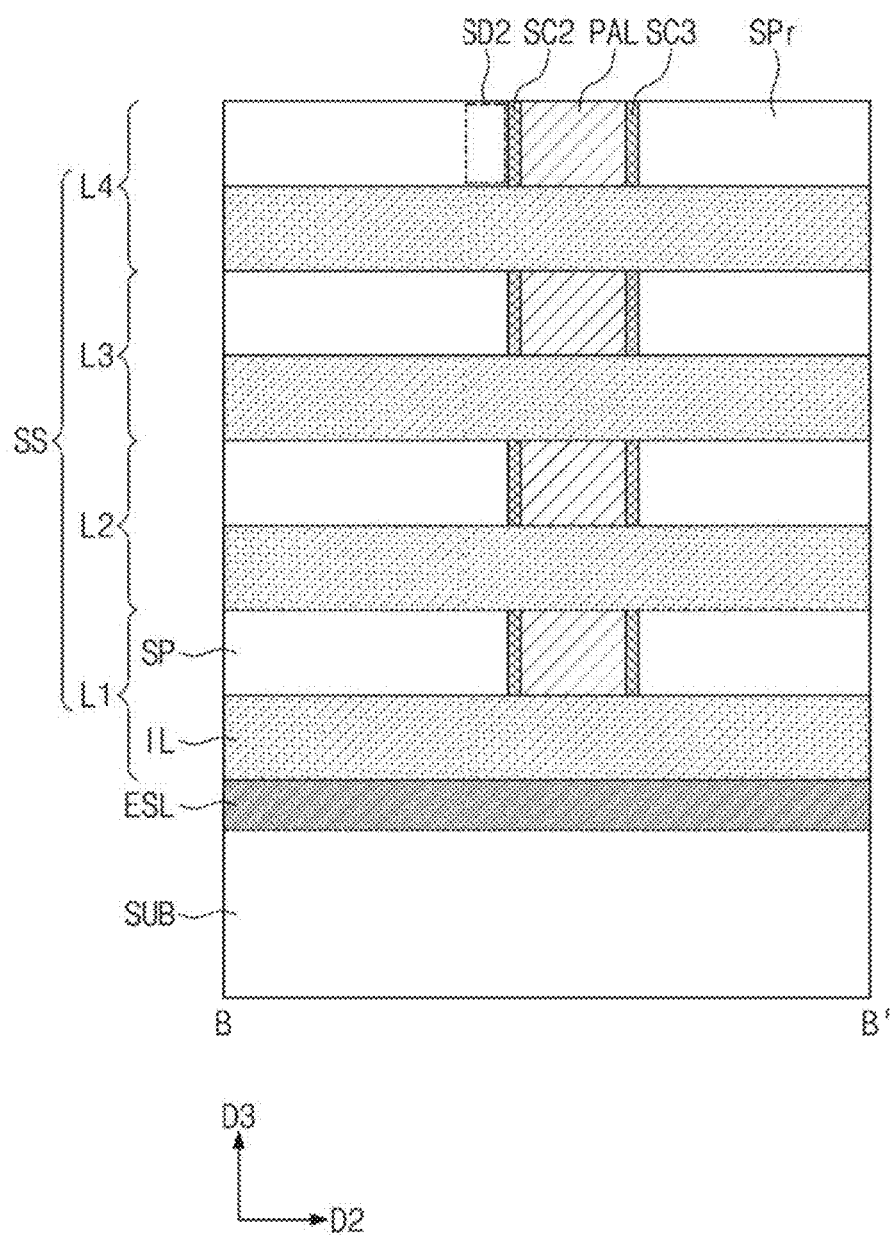
FIGS. 26B, 28B, 30B, 32B, and 34B are sectional views taken along lines B-B' of FIGS. 25, 27, 29, 31, and 33.

Referring to FIGS. 25, 26A, and 26B, an etching process may be performed to selectively remove the exposed portions of the semiconductor patterns SP from the resulting structure described with reference to FIGS. 9, 10A, and 10B. Since the portion of the semiconductor pattern SP is removed, the remaining semiconductor pattern SPr, which is spaced apart from the semiconductor pattern SP, may be formed, in addition to the semiconductor pattern SP.

An end portion of the semiconductor pattern SP and an end portion of the remaining semiconductor pattern SPr may be exposed by the first trench TR1. A silicidation process may be performed on the end portion of the semiconductor pattern SP and the end portion of the remaining semiconductor pattern SPr to form the second silicide pattern SC2 and a third silicide pattern SC3, respectively.

The second impurity regions SD2 may be formed in the semiconductor patterns SP, respectively, before the formation of the second and third silicide patterns SC2 and SC3. The formation of the second impurity region SD2 may include doping the exposed end portion of each of the semiconductor patterns SP with impurities.

A conductive layer PAL may be formed to fill the first trench TR1. The conductive layer PAL may fill a region, from which the semiconductor pattern SP is removed. In other words, the conductive layer PAL may be interposed between the semiconductor pattern SP and the remaining semiconductor pattern SPr.

Figure 27:
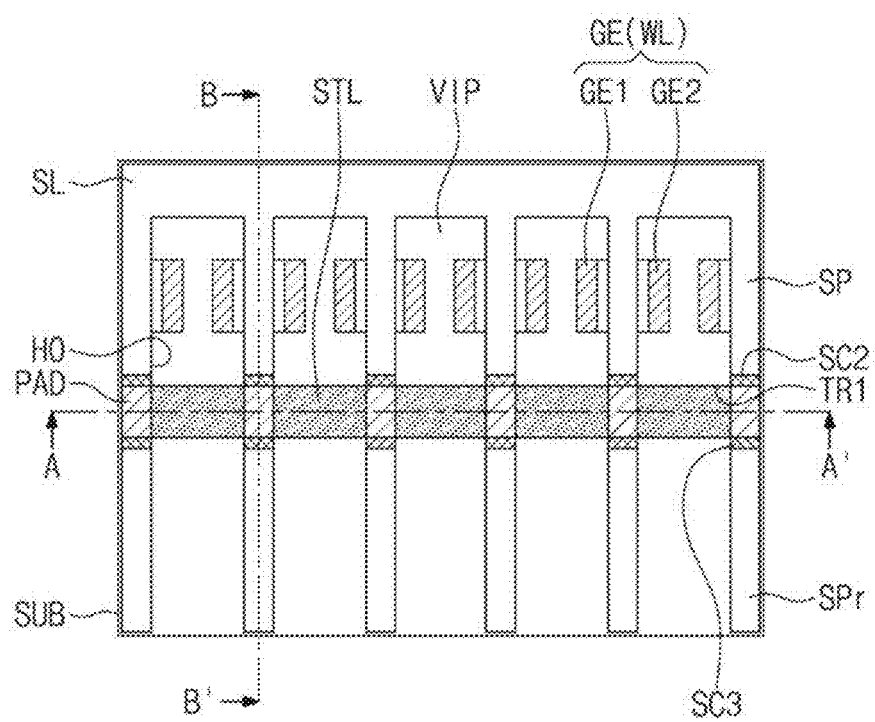
Figure 27:
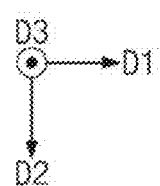
Figure 28A:
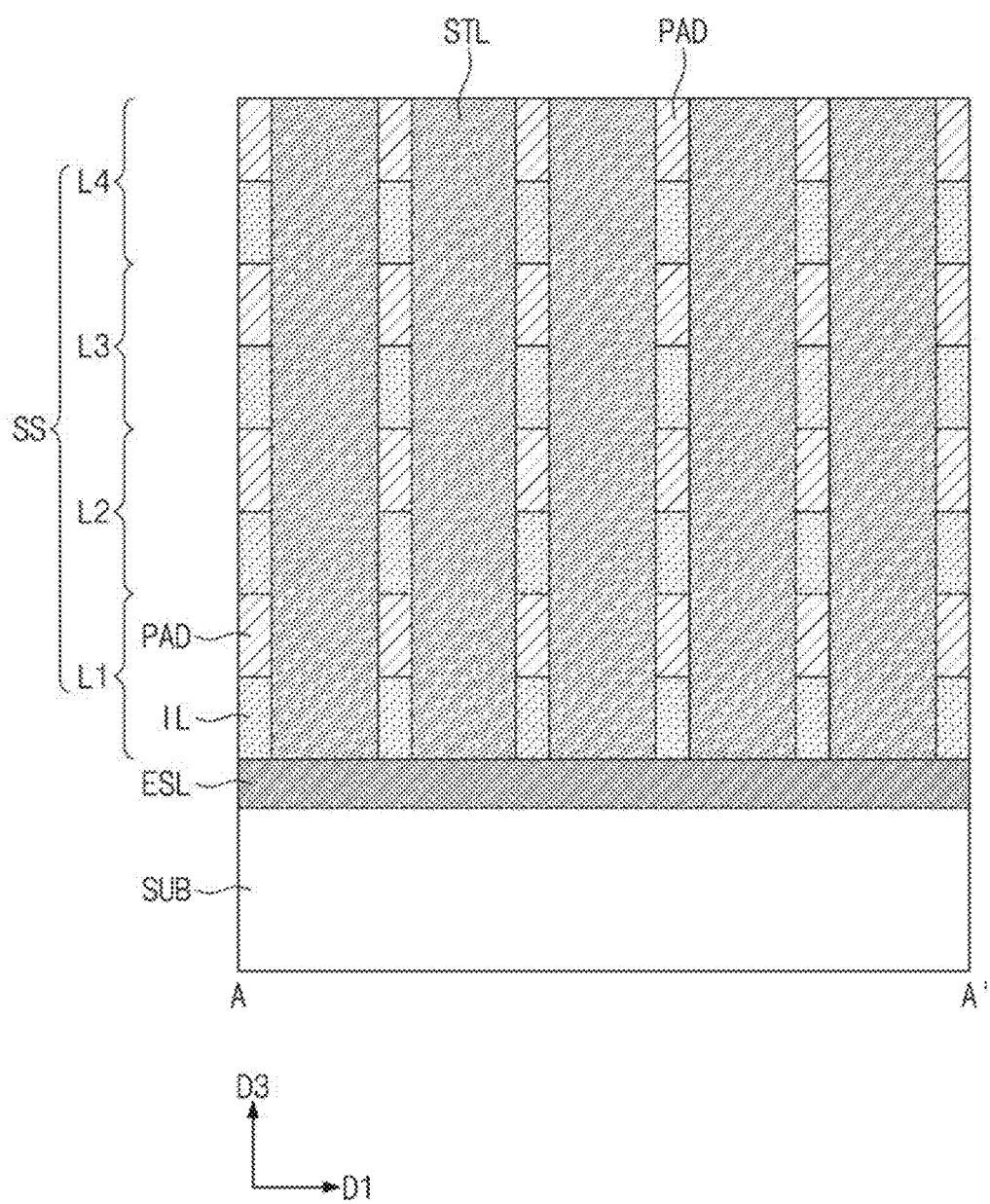
Figure 28B:
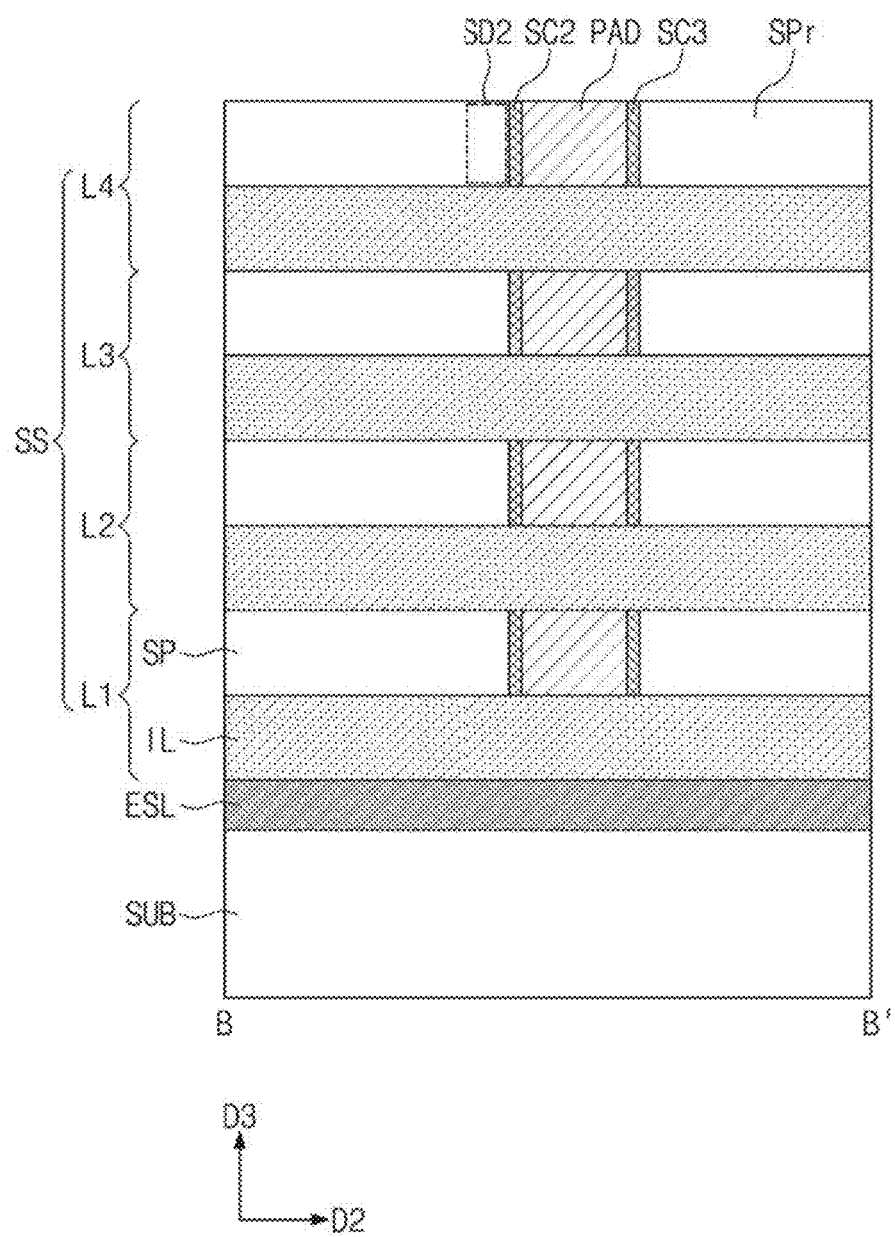

Referring to FIGS. 27, 28A, and 28B, an anisotropic etching process may be performed to selectively remove the conductive layer PAL, and as a result, the conductive pads PAD may be formed. The conductive pads PAD may be formed, in a self-aligned manner, using the insulating layer IL as an etch mask. For example, the conductive pad PAD may have the same width as that of the insulating layer IL thereon.

After the formation of the conductive pads PAD, the stopper layer STL may be formed to fill the first trench TR1. The stopper layer STL may be formed to fill a space between adjacent ones of the conductive pads PAD. In other words, the stopper layer STL may be interposed between the adjacent ones of the conductive pads PAD.

Figure 29:
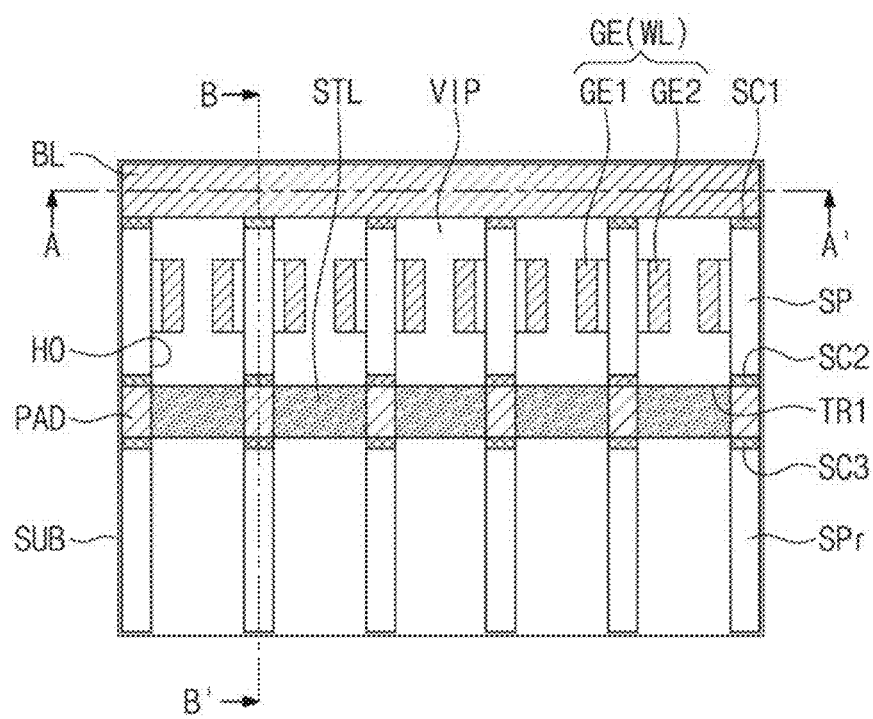
Figure 29:
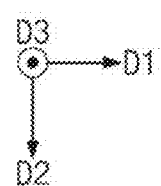
Figure 30A:
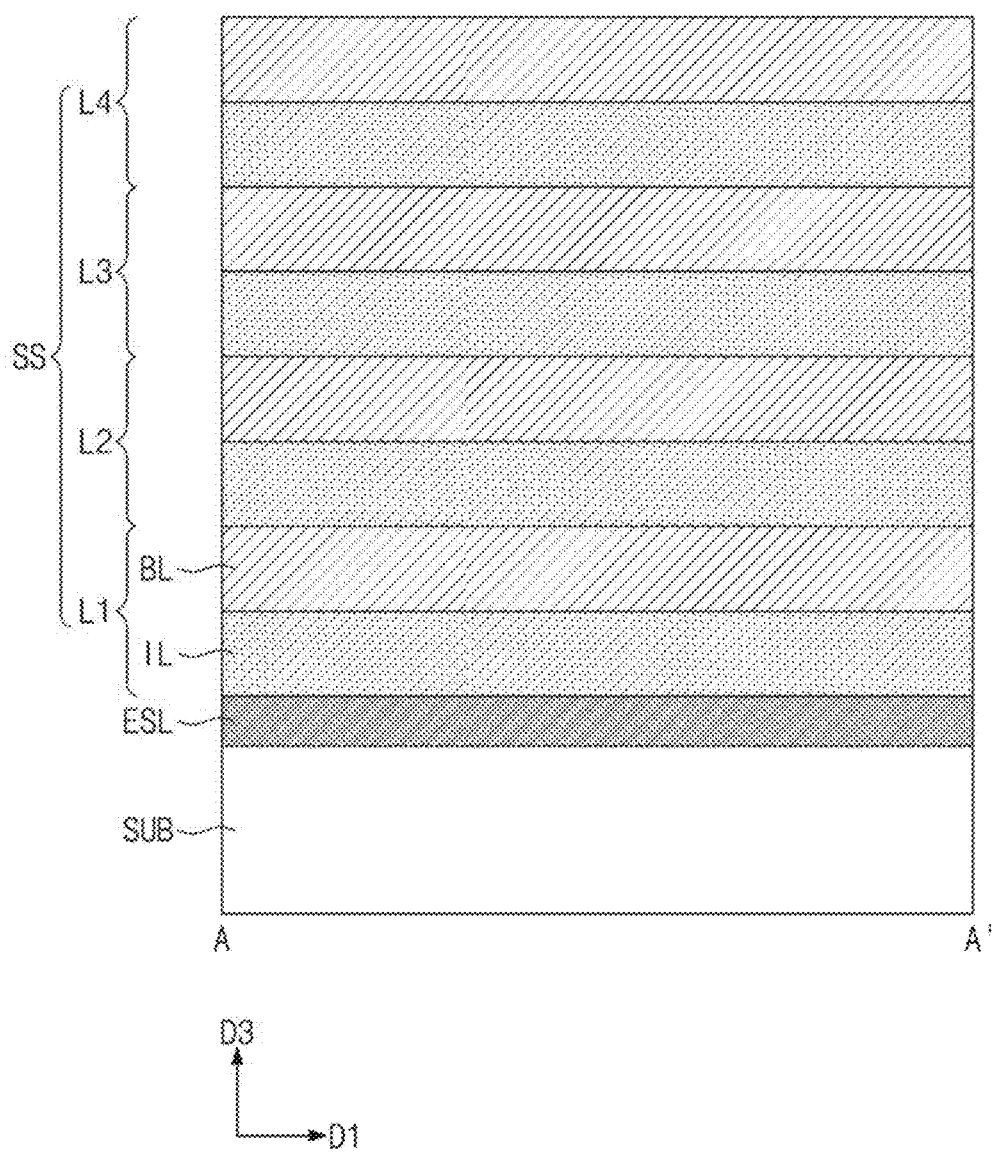
Figure 30B:
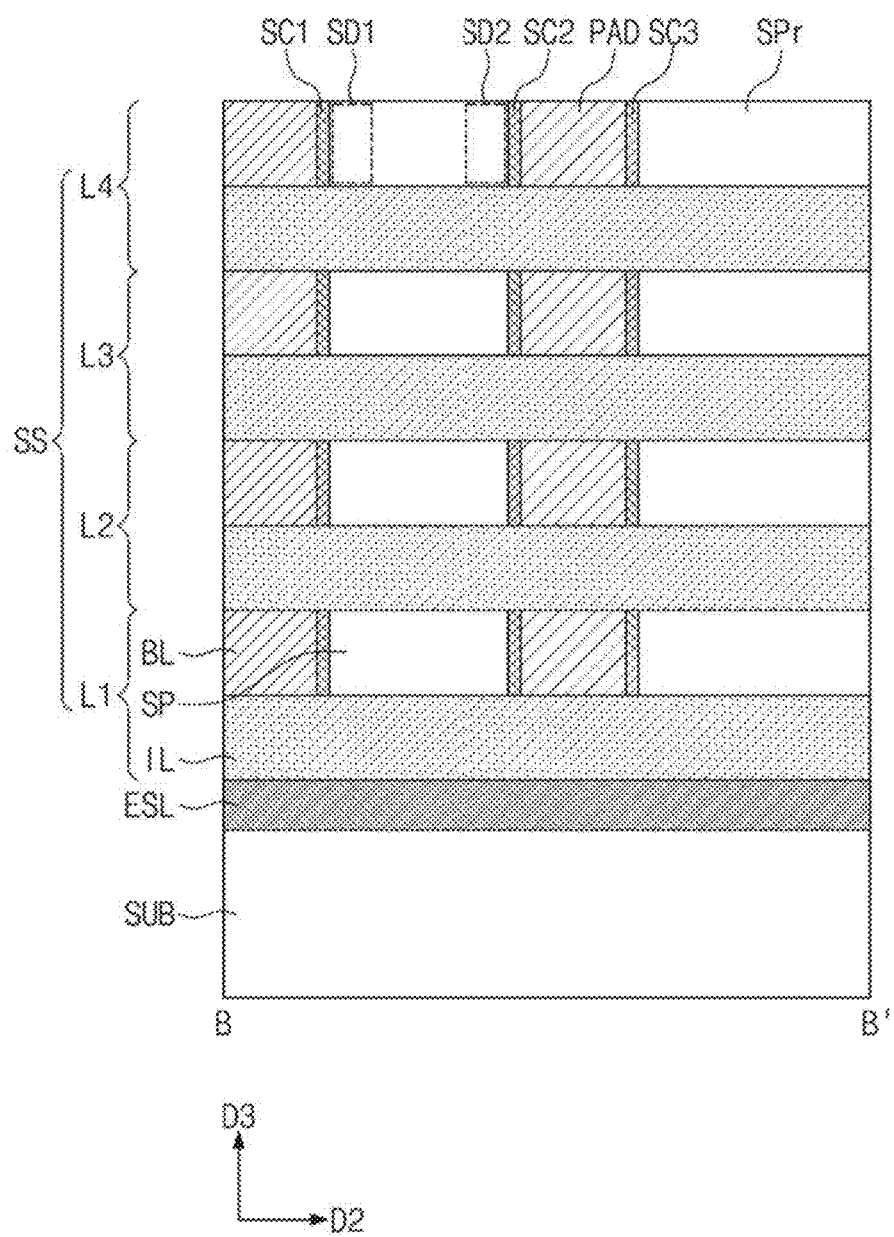

Referring to FIGS. 29, 30A, and 30B, a portion of the semiconductor layer SL, except for the semiconductor patterns SP, may be replaced with the bit line BL. The bit line BL may be extended in the first direction D1. The bit line BL may be electrically connected to the semiconductor patterns SP. The first impurity regions SD1 may be formed in the semiconductor patterns SP, respectively. The first silicide pattern SC1 may be formed between the bit line BL and each of the semiconductor patterns SP. The bit line BL, the first impurity region SD1 and the first silicide pattern SC1 may be formed by the same method as that described with reference to FIGS. 13, 14A, and 14B.

Figure 31:
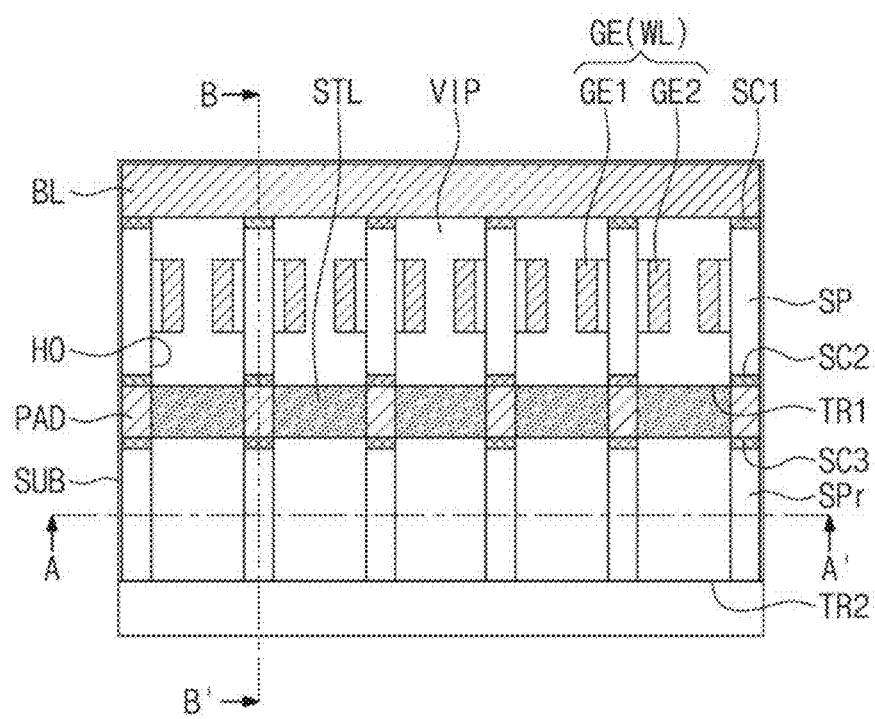
Figure 31:
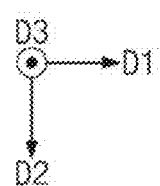
Figure 32A:
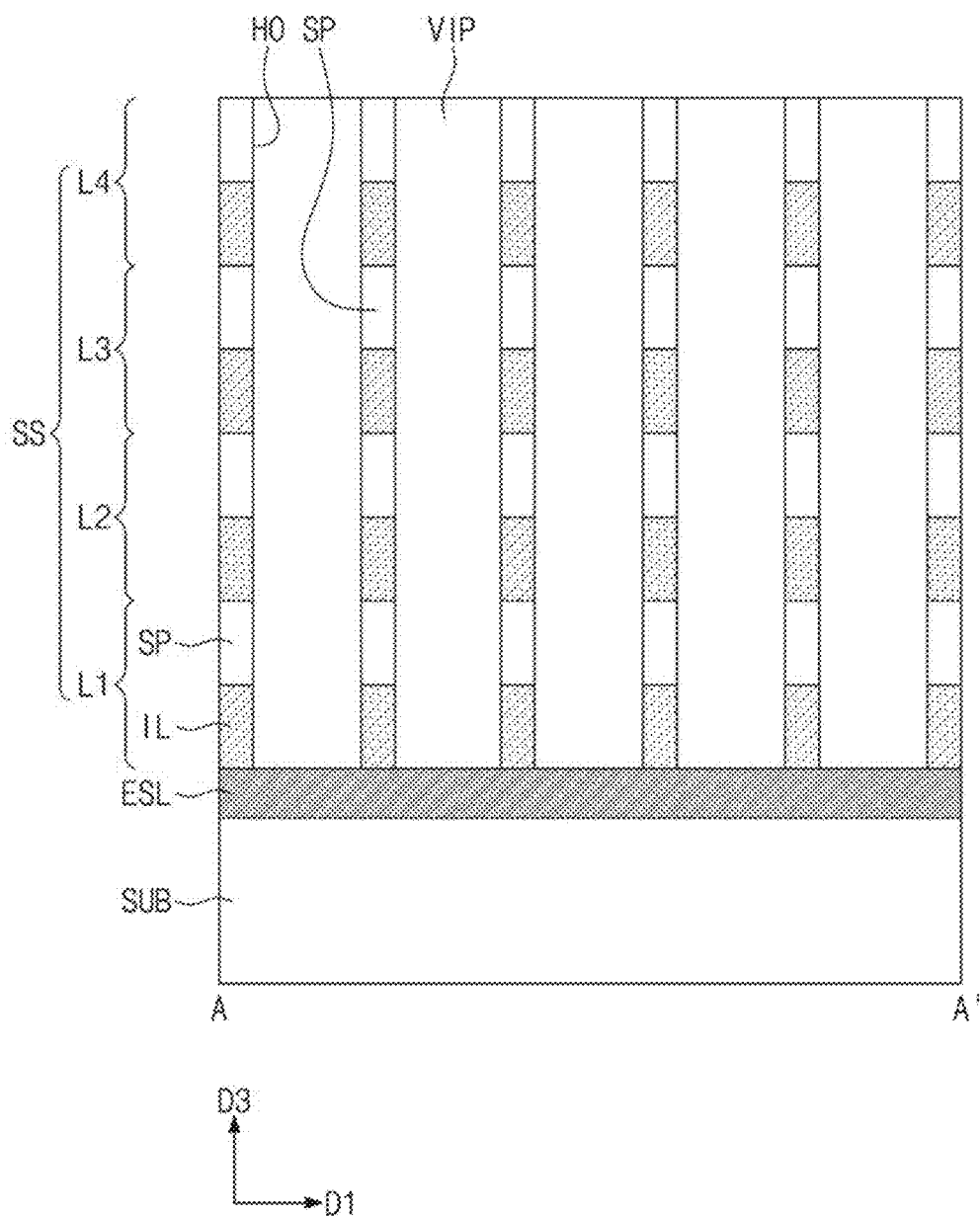
Figure 32B:
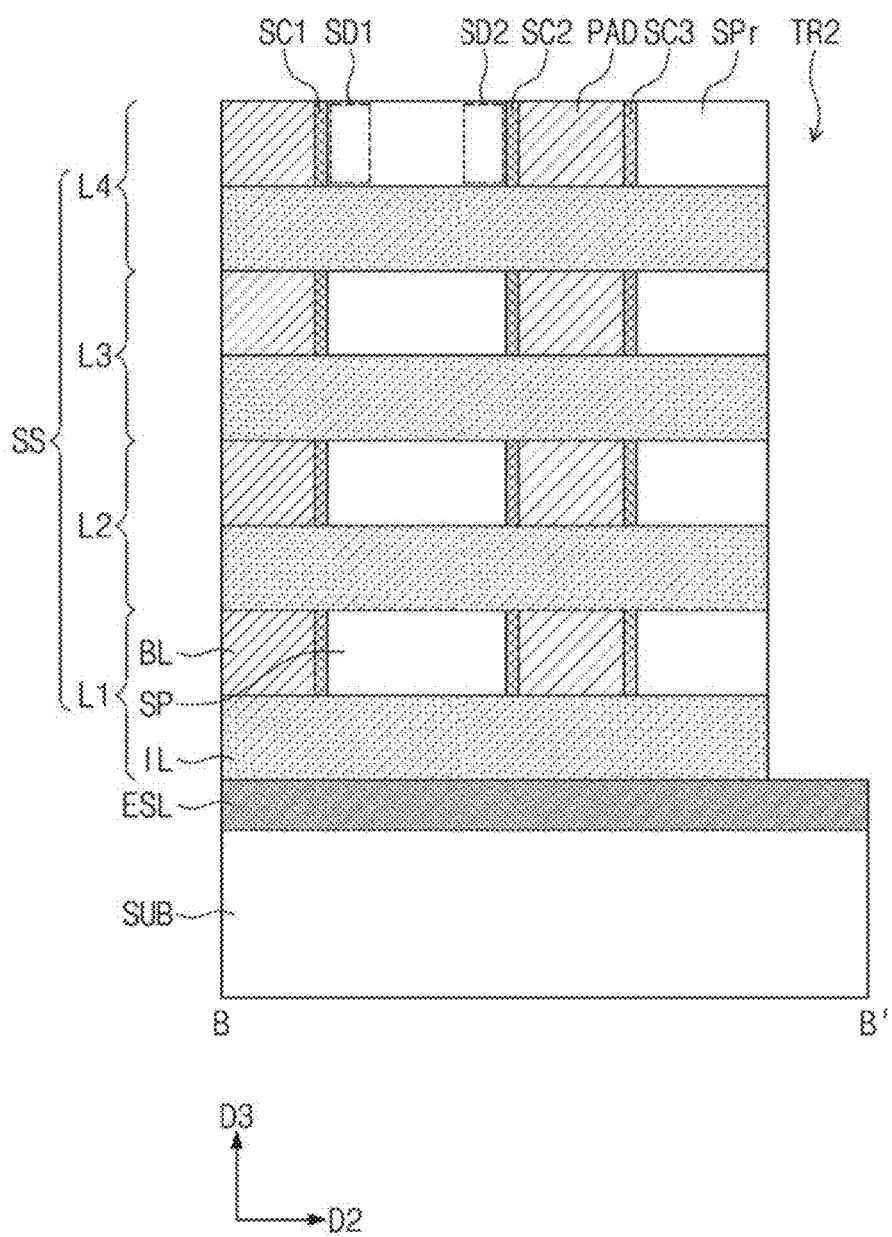

Referring to FIGS. 31, 32A, and 32B, the stack SS may be patterned to form the second trench TR2 penetrating the stack SS. The second trench TR2 may be formed to expose side surfaces of the remaining semiconductor patterns SPr, side surfaces of the insulating layers IL, and a side surface of the vertical insulating layer VIP. The second trench TR2 may be extended in the first direction D1.

Figure 33:
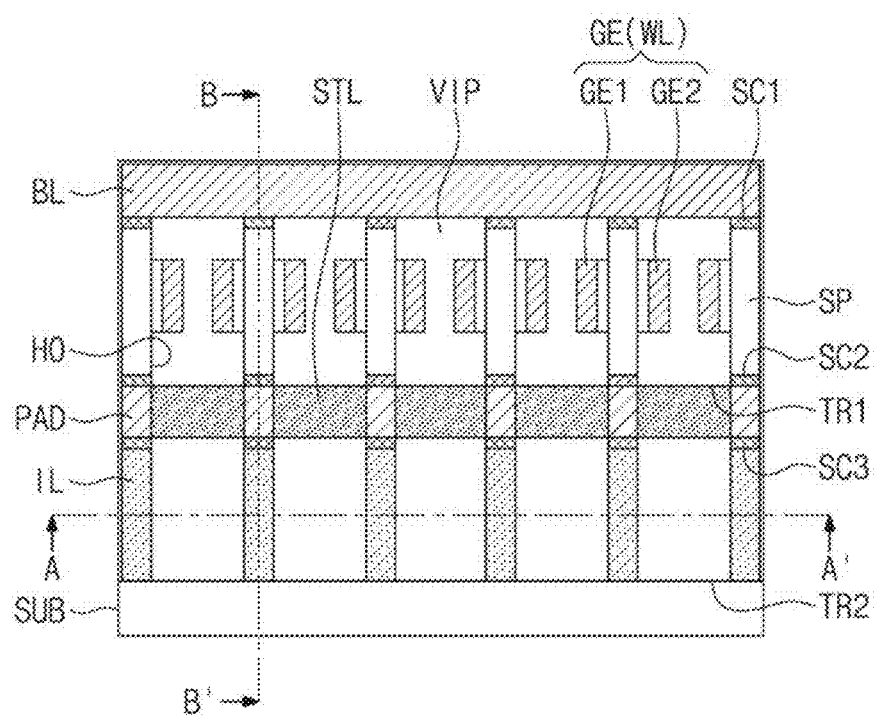
Figure 33:
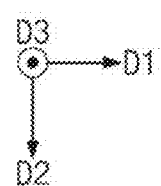
Figure 34A:
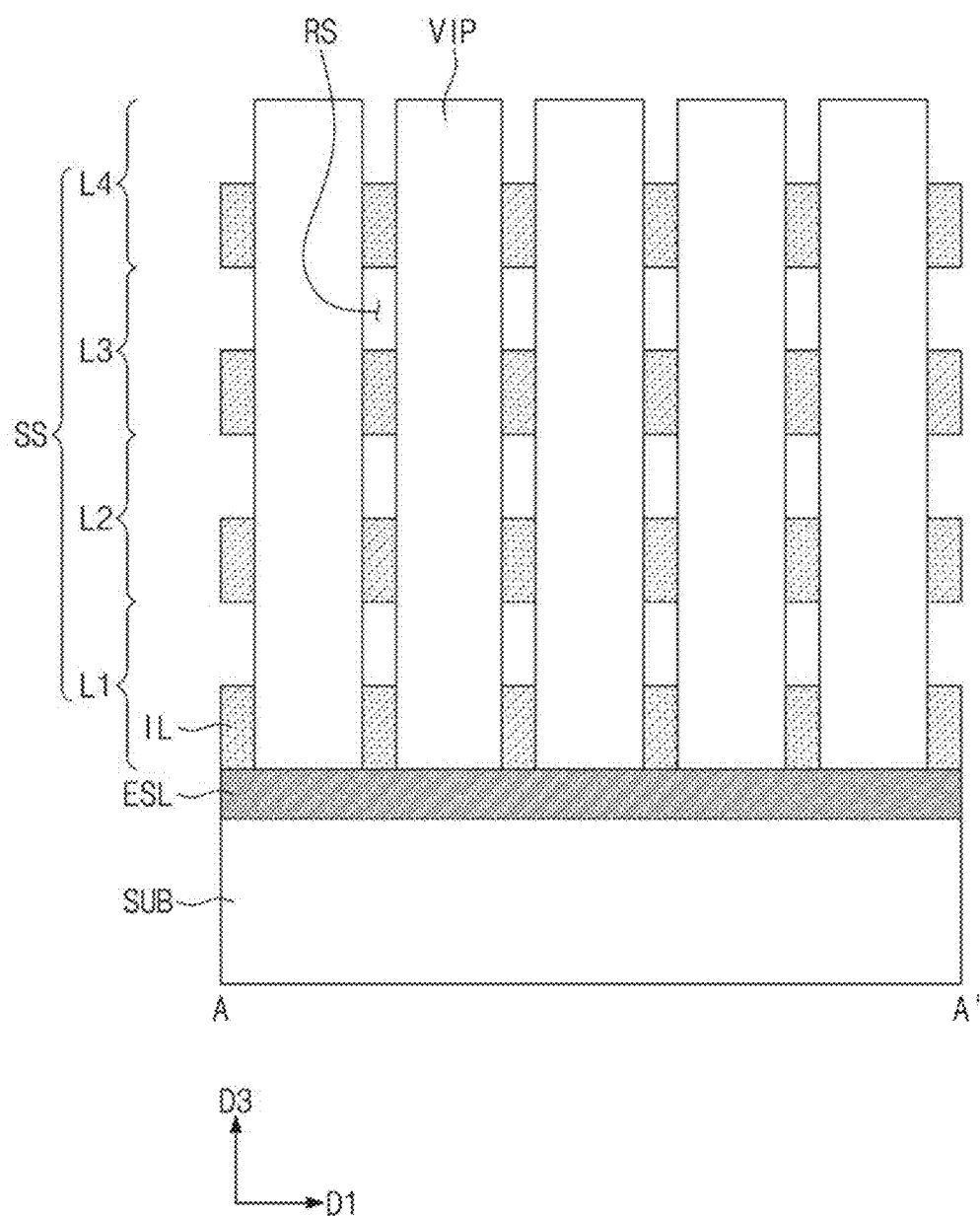
Figure 34B:
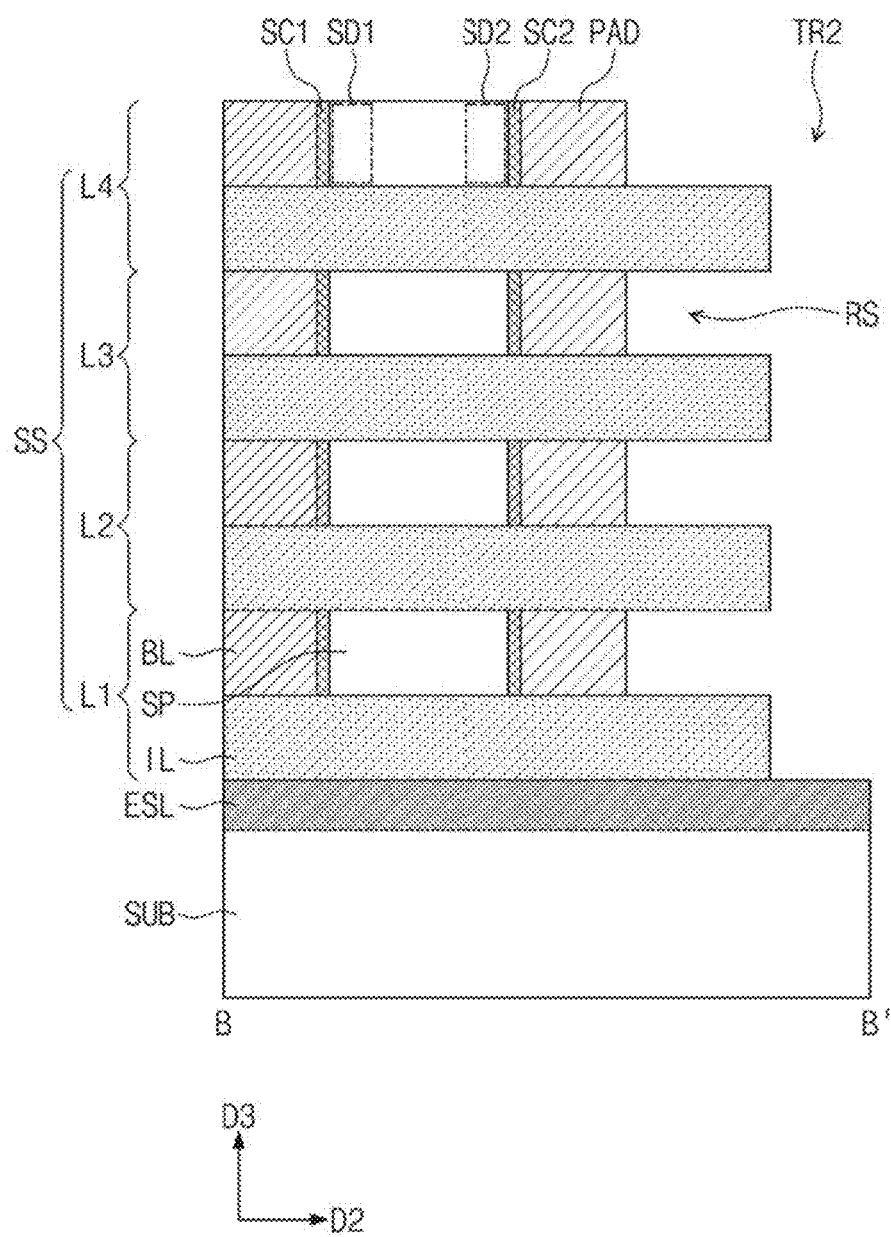

Referring to FIGS. 33, 34A, and 34B, the remaining semiconductor patterns SPr exposed through the second trench TR2 may be removed to form the recesses RS. The formation of the recesses RS may include performing a wet etching process to selectively etch the remaining semiconductor patterns SPr through the second trench TR2. The wet etching process may be performed to completely remove the remaining semiconductor pattern SPr and to expose the conductive pad PAD.

Referring back to FIGS. 23, 24A, and 24B, the subsequent process may be performed in the same manner as those previously described with reference to FIGS. 19 to 22B. For example, each of the recesses RS may be expanded. The first electrodes EL1 may be conformally formed in the expanded recesses RS, respectively. The first electrode EL1 may be in direct contact with the conductive pad PAD. The dielectric layer DL may be conformally formed on the first electrodes EL1. The second electrode EL2 may be formed on the dielectric layer DL.

According to some example embodiments of the inventive concepts, a three-dimensional semiconductor memory device may include a stopper layer, which is used to reduce a pattern-to-pattern variation in length of stacked semiconductor patterns. The use of the stopper layer may make it possible to improve the uniformity in size and shape of first electrodes, which are connected to the semiconductor patterns, respectively. As a result, it may be possible to improve electrical and reliability characteristics of three-dimensional semiconductor memory device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor memory device, comprising:
a stack including a plurality of layers vertically stacked on a substrate, each of the plurality of layers including a bit line, a semiconductor pattern horizontally extending from the bit line, and a gate electrode on the semiconductor pattern;
a vertical insulating layer penetrating the stack;
a stopper layer; and
a data storing element electrically connected to the semiconductor pattern of each of the plurality of layers,
wherein the data storing element includes
a first electrode electrically connected to the semiconductor pattern;
a second electrode on the first electrode; and
a dielectric layer between the first electrode and the second electrode, and
the stopper layer is between the vertical insulating layer and the second electrode.

2. The device of claim 1, further comprising:
a first silicide pattern between the semiconductor pattern and the bit line; and
a second silicide pattern between the semiconductor pattern and the first electrode.

3. The device of claim 1, wherein the semiconductor pattern comprises:
a first impurity region electrically connected to the bit line;
a second impurity region electrically connected to the first electrode; and
a channel region between the first and second impurity regions and adjacent to the gate electrode.

4. The device of claim 1, wherein the gate electrode comprises:
a first gate electrode adjacent to a first side of the semiconductor pattern; and
a second gate electrode adjacent to a second side of the semiconductor pattern, which is opposite to the first side of the semiconductor pattern.

5. The device of claim 1, wherein the stopper layer has an etch selectivity with respect to the vertical insulating layer.

6. The device of claim 1, wherein the stopper layer is vertically extended along the vertical insulating layer.

7. The device of claim 1, wherein the first electrode comprises:
a first portion adjacent to the stopper layer; and
a second portion horizontally extended from the first portion,
wherein a largest width of the first portion is smaller than a largest width of the second portion.

8. The device of claim 1, wherein each of the plurality of layers further includes a conductive pad between the semiconductor pattern and the first electrode, and
a largest width of the conductive pad is smaller than a largest width of the first electrode.

9. The device of claim 1, wherein the dielectric layer is between the stopper layer and the second electrode.

10. The device of claim 1, wherein each of the plurality of layers further includes an insulating layer below the semiconductor pattern.

11. A semiconductor memory device, comprising:
a stack including a plurality of layers vertically stacked on a substrate, each of the plurality of layers including a bit line, a semiconductor pattern horizontally extending from the bit line, and a gate electrode on the semiconductor pattern;
a first electrode electrically connected to the semiconductor pattern of each of the plurality of layers;
a stopper layer adjacent the first electrode;
a second electrode on the first electrode; and
a dielectric layer between the first electrode and the second electrode,
wherein the first electrode includes
a first portion adjacent to the stopper layer; and
a second portion horizontally extended from the first portion, and
a largest width of the first portion is smaller than a largest width of the second portion.

12. The device of claim 11, wherein the semiconductor pattern comprises:
a first impurity region electrically connected to the bit line;
a second impurity region electrically connected to the first electrode; and
a channel region between the first and second impurity regions and adjacent to the gate electrode.

13. The device of claim 11, wherein a length of the first portion is substantially equal to a width of the stopper layer.

14. The device of claim 11, wherein the dielectric layer is between the stopper layer and the second electrode.

15. The device of claim 11, further comprising a vertical insulating layer penetrating the stack,
wherein the stopper layer is between the vertical insulating layer and the second electrode.

16. A semiconductor memory device, comprising:
a stack including a plurality of layers vertically stacked on a substrate, each of the plurality of layers including a bit line, a semiconductor pattern horizontally extending from the bit line, and a gate electrode on the semiconductor pattern;
a first electrode electrically connected to the semiconductor pattern of each of the plurality of layers;

a conductive pad between the semiconductor pattern and the first electrode;

a stopper layer adjacent the conductive pad;

a second electrode on the first electrode; and a dielectric layer between the first electrode and the second electrode, wherein the first electrode includes a first portion adjacent to the stopper layer; and a second portion horizontally extended from the first portion, and a largest width of the conductive pad is smaller than a largest width of the first electrode.

17. The device of claim 16, wherein the semiconductor pattern comprises:

a first impurity region electrically connected to the bit line;

a second impurity region electrically connected to the first electrode; and a channel region between the first and second impurity regions and adjacent to the gate electrode.

18. The device of claim 16, wherein a length of the conductive pad is substantially equal to a width of the stopper layer.

19. The device of claim 16, wherein the dielectric layer is between the stopper layer and the second electrode.

20. The device of claim 16, further comprising a vertical insulating layer penetrating the stack, wherein the stopper layer is between the vertical insulating layer and the second electrode.

* * * * *